(12) United States Patent
Sumi et al.

(10) Patent No.: US 8,549,735 B2
(45) Date of Patent: Oct. 8, 2013

(54) COMPONENT-MOUNTING DEVICE, COMPONENT-MOUNTING SYSTEM, AND COMPONENT-MOUNTING METHOD

(75) Inventors: Hideki Sumi, Yamanashi (JP); Yoshiaki Awata, Yamanashi (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 13/503,706

(22) PCT Filed: Oct. 20, 2010

(86) PCT No.: PCT/JP2010/006233
§ 371 (c)(1),
(2), (4) Date: Apr. 24, 2012

(87) PCT Pub. No.: WO2011/052162
PCT Pub. Date: May 5, 2011

(65) Prior Publication Data
US 2012/0206732 A1 Aug. 16, 2012

(30) Foreign Application Priority Data

Oct. 26, 2009 (JP) .................................. 2009-245135

(51) Int. Cl.
*H05K 13/04* (2006.01)
(52) U.S. Cl.
USPC .................. 29/739; 29/759; 29/832; 29/833; 414/806; 356/237.1; 356/614
(58) Field of Classification Search
USPC ........... 29/705, 739–740, 830–833, 836, 759; 414/806; 356/237.1–237.5, 614–623
See application file for complete search history.

(56) References Cited

U.S. PATENT DOCUMENTS

| | | | |
|---|---|---|---|
| 6,594,887 B1 * | 7/2003 | Okuda et al. ................... | 29/739 |
| 6,918,176 B2 * | 7/2005 | Nagao et al. ................... | 29/832 |

(Continued)

FOREIGN PATENT DOCUMENTS

| | | |
|---|---|---|
| JP | 2001-015995 A | 1/2001 |
| JP | 2003-115657 A | 4/2003 |

(Continued)

OTHER PUBLICATIONS

International Search Report for PCT/JP2010/006233 dated Nov. 16, 2010.

*Primary Examiner* — Hoa Pham
(74) *Attorney, Agent, or Firm* — Pearne & Gordon LLP

(57) ABSTRACT

A challenge to be met by the present invention is to provide a component mounting device, a component mounting system, and a component mounting method that make it possible to correctly position a substrate at a working location and mount components on the substrate even when components mounted on the substrate project outside from an end of the substrate in a direction parallel to a substrate conveyance path. When a front end portion (PbT) of a substrate (Pb) conveyed by a substrate conveyance path (13) is detected to have reached inspection light (L), operation of the substrate conveyance path (13) is immediately halted. When a front end portion (PtT) of a projecting portion H of a component (Pt) mounted on the substrate Pb is detected to have reached the inspection light (L), the substrate conveyance path (13) is activated in such a way that the substrate (Pb) moves in the direction of projection of the projecting portion (H) over a distance equivalent to a projection length (α) of the projecting portion (H) reached the inspection light (L) and is subsequently stopped, thereby positioning the substrate (Pb).

6 Claims, 17 Drawing Sheets

(56) References Cited

U.S. PATENT DOCUMENTS

| | | | |
|---|---|---|---|
| 2003/0051344 A1* | 3/2003 | Terui | 29/890.142 |
| 2004/0033128 A1* | 2/2004 | Kabeshita et al. | 414/935 |
| 2009/0225304 A1* | 9/2009 | Hiyoshi et al. | 356/72 |
| 2011/0225811 A1* | 9/2011 | Kodama et al. | 29/739 |
| 2012/0011714 A1* | 1/2012 | Hattori et al. | 29/832 |

FOREIGN PATENT DOCUMENTS

| | | |
|---|---|---|
| JP | 2005-045140 A | 2/2005 |
| JP | 2009-135265 A | 6/2009 |

* cited by examiner

| | X | Y | θ | α | ... |
|---|---|---|---|---|---|
| 1 | X0 | Y0 | 0 | 0.5a−X0 | |
| 2 | | | | | |
| 3 | | | | | |
| ⋮ | | | | | |

COMPONENT-MOUNTING DEVICE, COMPONENT-MOUNTING SYSTEM, AND COMPONENT-MOUNTING METHOD

TECHNICAL FIELD

The present invention relates to a component mounting device, a component mounting system, and a component mounting method for mounting component on a substrate located at a working location.

BACKGROUND ART

A component mounting device that mounts a component, such as electronic component, on a substrate located at a working location has a substrate conveyance path made up of a pair of conveyance belts. The substrate conveyance path supports both ends of the substrate from below, thereby conveying and locating the substrate. Locating the substrate by the substrate conveyance path as mentioned above is performed by halting conveyance of the substrate performed by the substrate conveyance path when ends of the conveyed substrate achieved along a direction of the substrate conveyance path are detected as having reached inspection light projected in a direction orthogonal to the direction of conveyance of the substrate (see; for instance, Patent Document 1).

RELATED ART DOCUMENT

Patent Document

Patent Document 1: JP-A-2009-135265

SUMMARY OF THE INVENTION

Problem that the Invention is to Solve

However, like connector components, some of the components mounted on the substrate are provided so as to protrude outside from the end of the substrate. When an end of the projecting portion of the component has reached the inspection light before the end of the substrate reaches the inspection light, there arises a problem of the inability to correctly locate the substrate at a working location that is a target for the substrate.

Accordingly, the present invention aims at providing a component mounting device, a component mounting system, and a component mounting method that make it possible to accurately place a substrate at a working location and mount a component even when a component mounted on a substrate is provided so as to protrude outside from an end of the substrate in a direction parallel to a substrate conveyance path.

Means for Solving the Problem

A component mounting device of the present invention comprises: a substrate conveyance path that conveys a substrate while supporting the substrate from below; a light projector that projects inspection light in a direction orthogonal to a direction of conveyance of the substrate by the substrate conveyance path and a light receiver that receives the inspection light projected by the light projector; an end detection unit which, according to a change in an amount of inspection light received by the light receiver, detects that an end of the substrate conveyed by the substrate conveyance path in a direction parallel to the substrate conveyance path or an end of a portion projecting outside from an end of a component mounted on the substrate in a direction parallel to the substrate conveyance path for the substrate has reached the inspection light; a substrate positioning control unit which immediately halts operation of the substrate conveyance path when the end detection unit detects that the end of the substrate has reached the inspection light and which, when the end detection unit detects that the end of the projection portion of the component mounted on the substrate has reached the inspection light, activates the substrate conveyance path such that the substrate moves in a projecting direction of the projecting portion over a distance equivalent to a projection length of the projecting portion reached the inspection light and subsequently halts the substrate conveyance path, thereby positioning the substrate; and a mounting section that mounts components on the substrate positioned by the substrate positioning control unit.

In connection with the above configuration, the component mounting device further comprises a projection length data calculation a that calculates data pertaining to projection lengths of respective components from data including locations on the substrate where components to be mounted on the substrate are mounted and outer dimensions of the components.

In connection with the above configuration, the component mounting device further comprises a projection length data input unit that inputs data pertaining to a projection length on a per-component basis.

A component mounting system of the present invention is built as a result of the plurality of component mounting devices each of which has the foregoing configuration being arranged side by side, and the component mounting system sequentially delivers a substrate among the plurality of component mounting devices and shares operation for mounting components on the substrate among the respective component mounting devices. Projection length data pertaining to the substrate on which the components are mounted by an upstream component mounting devices are delivered to the downstream component mounting device.

In connection with the configuration, the projection length data delivered from the upstream component mounting device to the downstream component mounting device are only projection length data pertaining to a component having the largest projection length among the component mounted on the substrate by the upstream component mounting device.

A component mounting method of the present invention comprises: a substrate conveyance step of conveying a substrate while supporting both sides of the substrate from below by a substrate conveyance path; a substrate positioning step of immediately halting operation of the substrate conveyance path when an end of the substrate achieved in a direction parallel to the substrate conveyance path is detected to have reached inspection light and, when an end of a projecting portion of a component mounted on the substrate is detected to have reached the inspection light, activating the substrate conveyance path such that the substrate moves in a projecting direction of a projecting portion over a distance equivalent to a projection length of the projecting portion reached the inspection light and subsequently halting the substrate conveyance path, thereby positioning the substrate; and a mounting step of mounting components on the substrate positioned.

Advantage of the Invention

In the present invention, when the end of the substrate conveyed by the substrate conveyance path in the direction parallel to the substrate conveyance path is detected to have reached the inspection light, operation of the substrate conveyance path is immediately stopped. When the end of the projecting portion of the component mounted on the substrate is detected to have reached the inspection light, the substrate conveyance path is activated such that the substrate moves in a projecting direction of the projecting portion over a distance equivalent to a projection length of the projecting portion reached the inspection light and subsequently halted. Even when components mounted on the substrate are provided so as to project outside from the end of the substrate in the direction parallel to the substrate conveyance path, the components can be positioned while the substrate is correctly positioned at the working location.

BRIEF DESCRIPTION OF THE DRAWINGS

FIG. 6(b) is a side view of the same.

EMBODIMENT FOR IMPLEMENTING THE INVENTION

Figure 1:
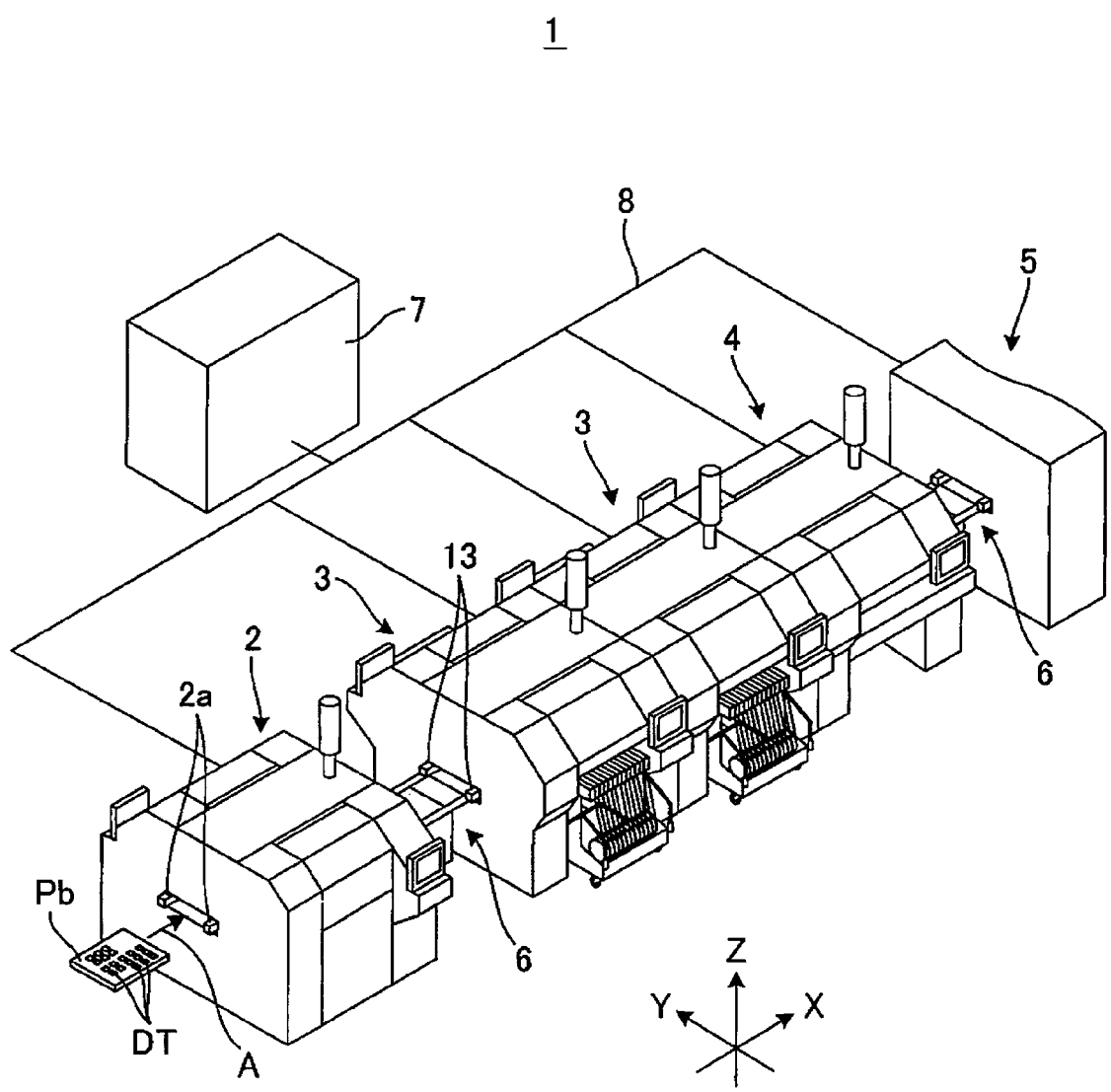
FIG. 1 is an oblique perspective view of a component mounting system of an embodiment of the present invention.

An embodiment of the present invention is hereunder described by reference to the drawings. As shown in FIG. 1, a component mounting system 1 of the embodiment of the present invention is configured in such a way that a solder printer 2, two component mounting devices 3; i.e., an upstream component mounting device 3 (situated on the left side in FIG. 1) and a downstream component mounting device 3 (situated on the right side in FIG. 1), an inspection device 4, and a reflow furnace 5 are arranged side by side along a direction of conveyance of a substrate Pb. A substrate conveyor device 6 is interposed between the solder printer 2 and the upstream component mounting device 3, and another substrate conveyor device 6 is interposed between the inspection device 4 and the reflow furnace 5. The devices and a host computer 7 are linked together by a LAN cable 8 of a local area network (LAN), thereby being able to exchange information. For the sake of explanation, a horizontal in-plane direction extending along the direction of conveyance of the substrate Pb in the component mounting system 1 is taken as an X-axis direction (a longitudinal direction), and a horizontal in-plane direction orthogonal to the X-axis direction is taken as a Y-axis direction (a lateral direction). Further, a vertical direction is taken as a Z-axis direction.

In FIG. 1, the solder printer 2 receives the substrate Pb loaded in the direction of arrow A shown in the drawing by a substrate conveyance path 2a built from a pair of conveyance belts and conveys the thus-received substrate in the X-axis direction. The solder printer then positions the substrate at a predetermined working location and then prints a plurality of electrodes DT provided on the substrate Pb with solder. The substrate Pb printed with solder is conveyed out to the substrate conveyor device 6 that is a downstream device, and the substrate conveyor device 6 conveys the substrate Pb to the (upstream) component mounting device 3.

Figure 2:
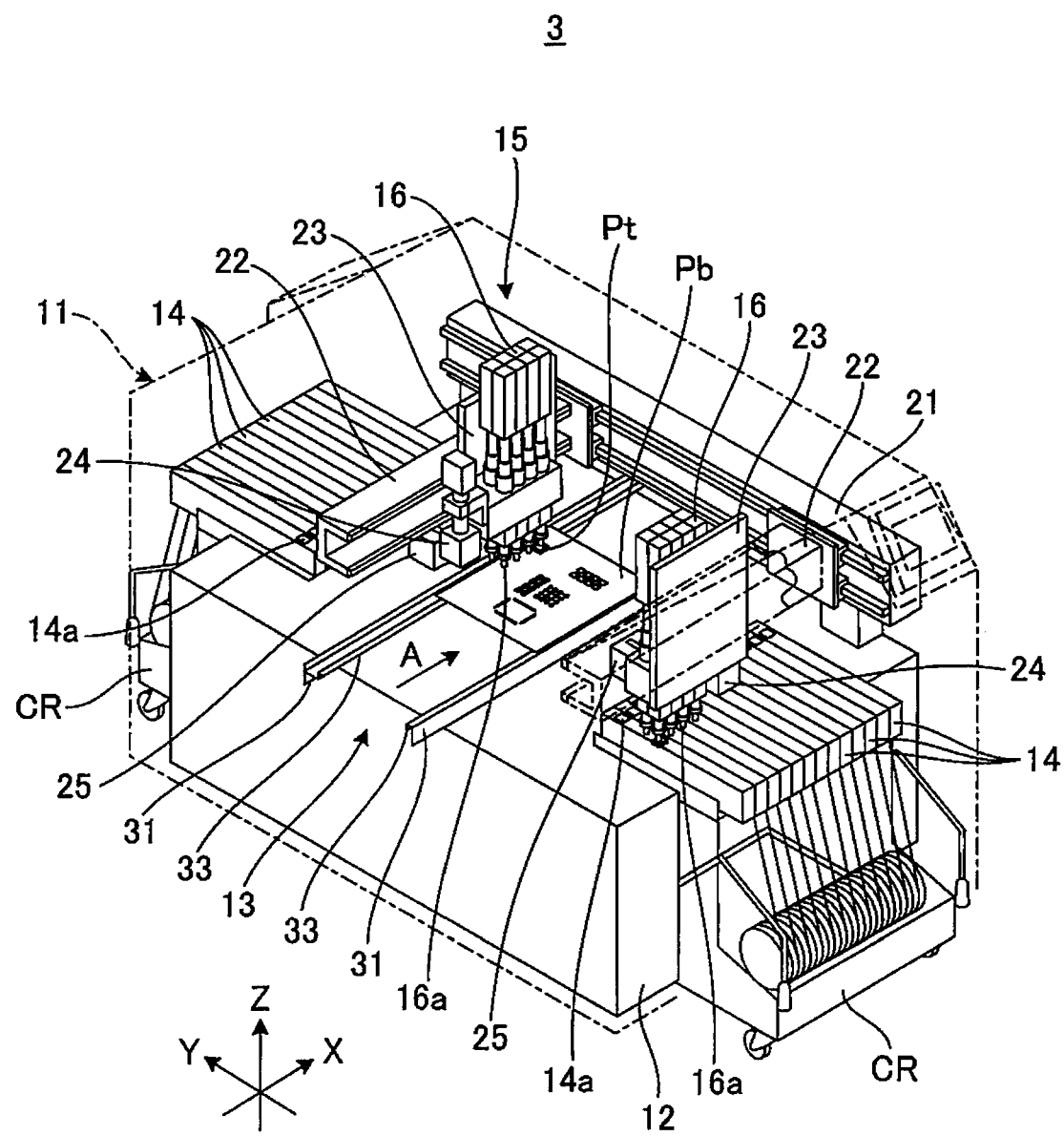
FIG. 2 is an oblique perspective view of a component mounting device of the embodiment of the present invention.
Figure 3:
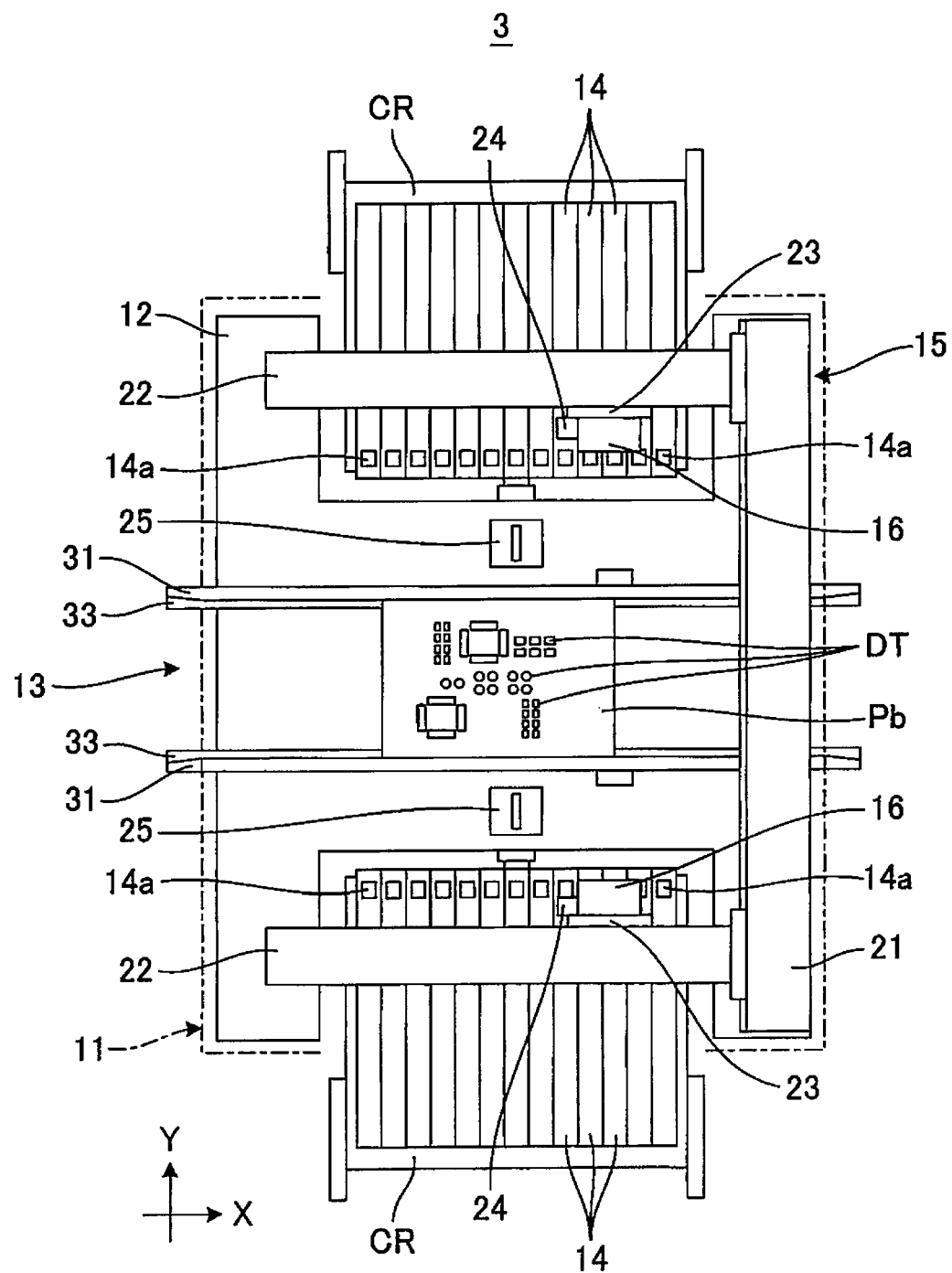
FIG. 3 is a plan view of the component mounting device of the embodiment of the present invention.

In FIGS. 2 and 3, each of the upstream component mounting device 3 and the downstream component mounting device 3 is equipped with a substrate conveyance path 13 that serves as a substrate positioning section, a plurality of component feeders 14 serving as a component feeding section, a head actuation mechanism 15 built from an XY robot, and two mounting heads 16 that are provided so as to be independently movable with respect to a bed 12 by way of the head actuation mechanism 15 and that serve as a component mounting section, all of which are mounted on the bed 12 covered with a cover member 11. The substrate conveyance path 13 conveys the substrate Pb received from an upstream device (the solder printer 2 for the upstream component mounting device 3 and the upstream component mounting device 3 for the downstream component mounting device 3) in the X-axis direction and positions the thus-conveyed substrate at the predetermined working location (the position shown in FIGS. 2 and 3) at the center of the bed 12.

In FIGS. 2 and 3, the plurality of component feeders 14 are set side by side along the X-axis direction and at respective end areas of the bed 12 that oppose each other along the Y-axis direction with the substrate conveyance path 13 sandwiched therebetween. The plurality of component feeders 14 are held by respective carriages CR that are driven on a floor by an operator (not shown). The operator joints the carriages CR to the bed 12, whereby the plurality of component feeders 14 are collectively mounted on the bed 12. The respective component feeders 14 mounted on the bed 12 consecutively feed component Pt to be mounted on the substrate Pb to respective component feed ports 14a provided at respective ends of a center area of the bed 12 (i.e., an area of the substrate conveyance path 13).

In FIGS. 2 and 3, the two mounting heads 16 each are movable within a horizontal plane by the head actuation mechanism 15. Each of the mounting heads 16 has a plurality of downwardly-extended suction nozzles 16a so as to be vertically movable and turnable around a vertical axis (the Z axis). The head actuation mechanism 15 includes a beam-shaped Y-axis table 21 that is fastened at both ends thereof to an upper surface of the bed 12 and that is provided so as to extend in the Y-axis direction so as to straddle the substrate conveyance path 13; two beam-shaped X-axis tables 22 each of which is supported at one end by the Y-axis table 21, which extends in the X-axis direction, and which is provided so as to be movable along the Y-axis table 21 (i.e., in the Y-axis direction); and two movable stages 23 each of which is provided so as to be movable along the X-axis table 22 (i.e., the X-axis direction). Each of the two movable stages 23 is equipped with one corresponding mounting head 16.

In FIGS. 2 and 3, each of the two movable stages 23 provided in the head actuation mechanism 15 is provided with a substrate camera 24 whose imaging field of view is oriented downwardly. Component cameras 25 each imaging field of view of which is oriented upwardly are disposed in areas on the bed 12 where the substrate conveyance path 13 is positioned in a sandwiched manner.

Figure 4:
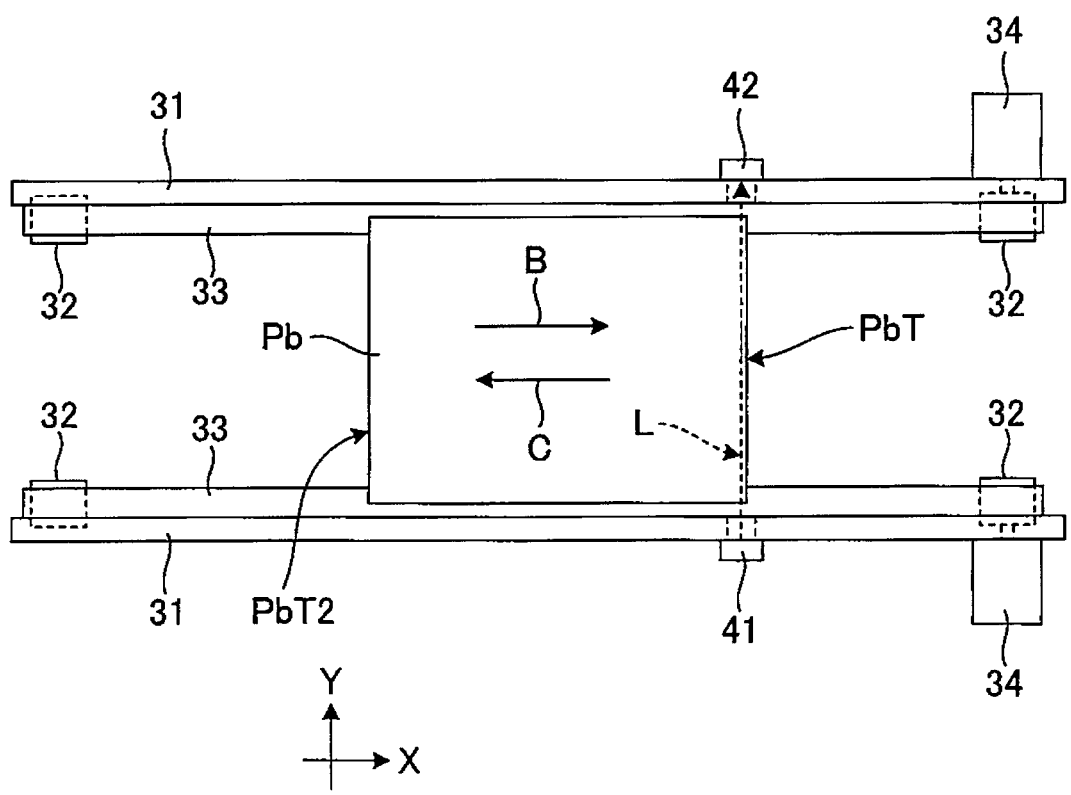
FIG. 4 is a plan view of a substrate conveyance path provided in the component mounting device of the embodiment of the present invention.
Figure 5:
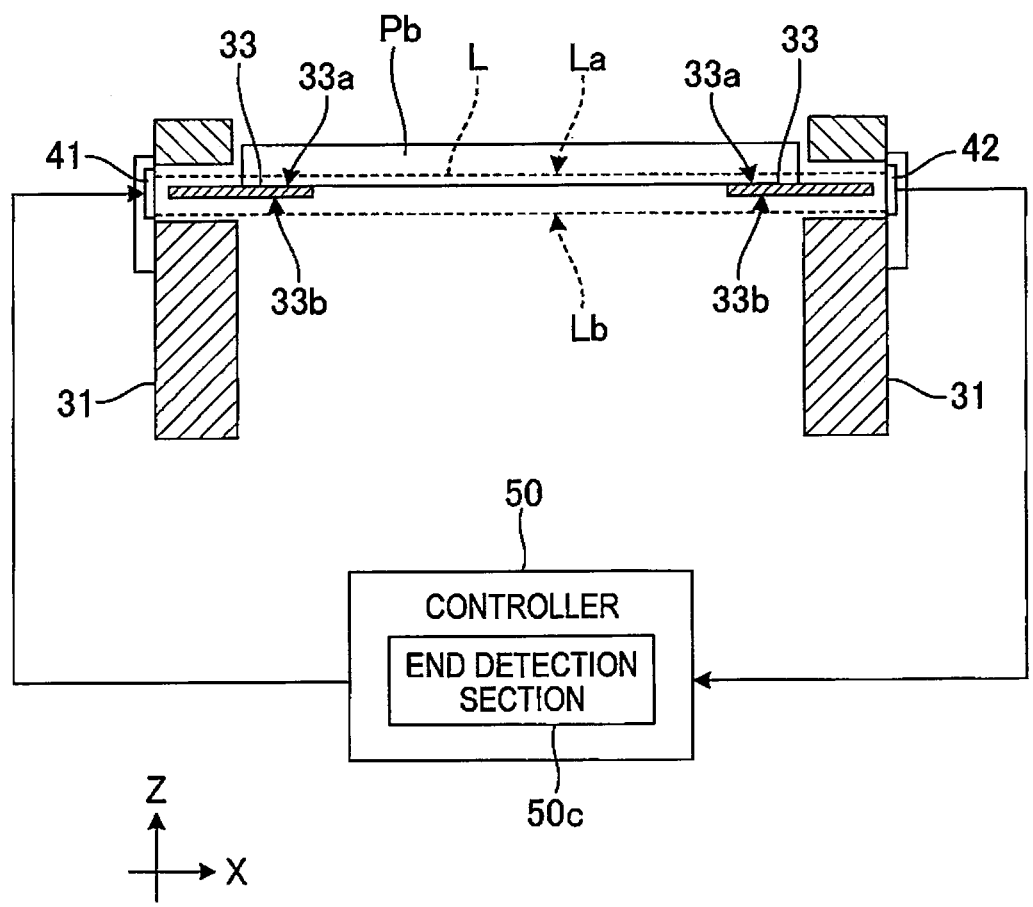
FIG. 5 is a partially cross sectional side view of the substrate conveyance path provided in the component mounting device of the embodiment of the present invention.

As shown in FIGS. 4 and 5, the substrate conveyance path 13 includes a pair of frames 31 laid on the bed 12 so as to extend in the X-axis direction (see also FIGS. 2 and 3), a plurality of pulleys 32 that are each mounted on the pair of frames 31, and a pair of conveyance belts 33 each of which is passed around the plurality of pulleys 32 mounted on the corresponding frame 31 (see also FIGS. 2 and 3). A rotary shaft of a conveyance drive motor 34 fastened to the corresponding frame 31 is coupled to one of the plurality of pulleys 32 around which the corresponding conveyance belt 33 is passed. The conveyance drive motors 34 are driven, thereby enabling the pair of conveyance belts 33 to let the substrate Pb travel in a direction of arrow B shown in FIG. 4 (a longitudinal direction) or a direction of arrow C (a receding direction) opposite to the arrow B.

Figure 6:
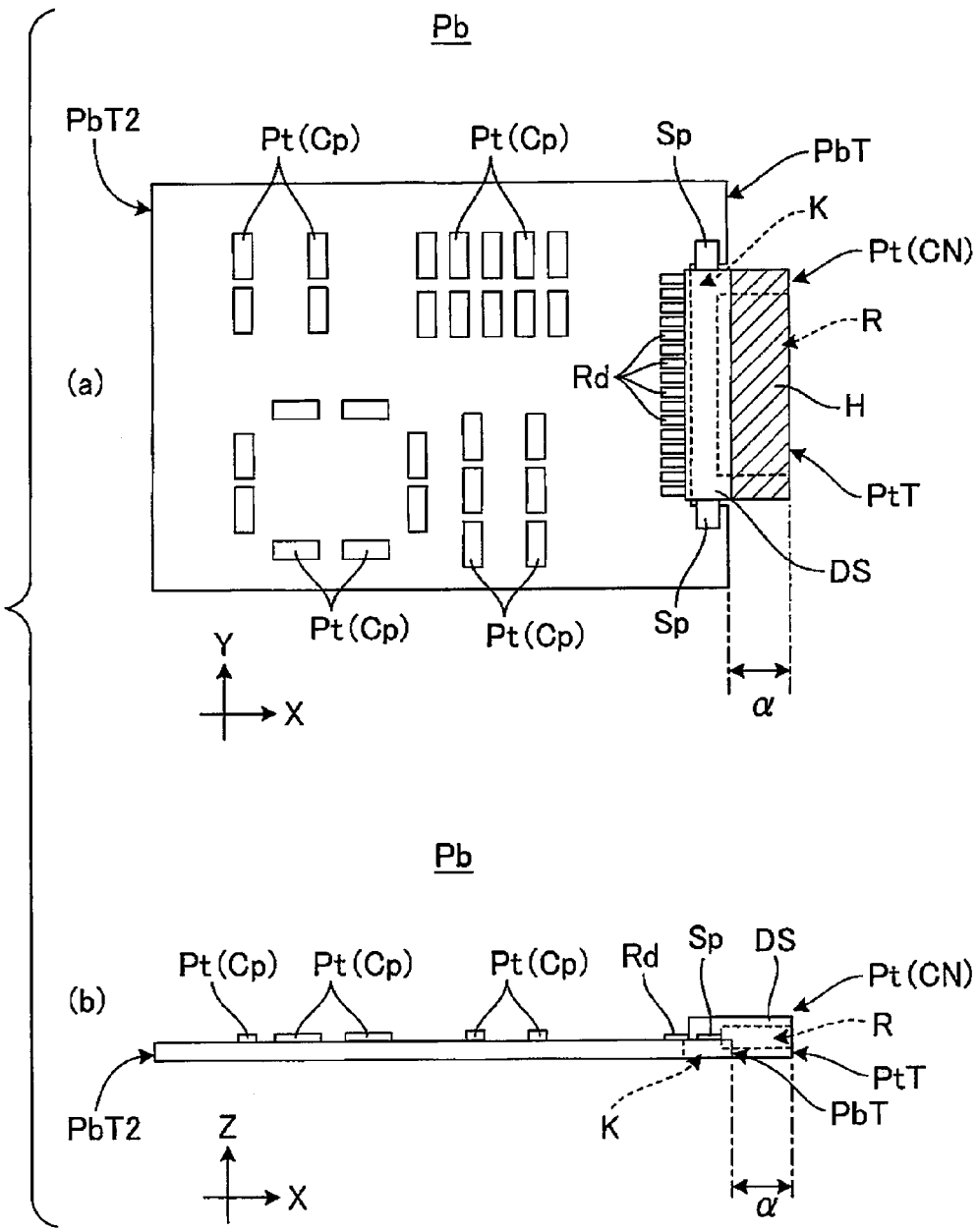
FIG. 6 (a) is a plan view of a substrate on which components are mounted by the component mounting device of the embodiment of the present invention.

As shown in FIGS. 6(a) and (b), component Pt mounted on the substrate Pb by the component mounting device 3 include component which are mounted, like connector component CN, so as to protrude outside (forward) from an end (a front end portion PbT) of the substrate Pb along the direction of the substrate conveyance path 13 as well as electronic component Cp, like chip component, which are attached so as not to protrude from an end (the front end portion PbT or a rear end portion PbT2) of the substrate Pb along the direction of the substrate conveyance path 13. In the connector component CN, an insulation area DS made of an electrically insulating resin is placed so as to be situated in a notch K formed in the front end portion PbT of the substrate Pb. A plurality of leads Rd and a pair of support pieces Sp that extend from the insulation area DS are mounted on electrodes (not shown) provided on a surface of the substrate Pb. A receipt opening R fits to an unillustrated other connector component is formed at a forward end of the insulation area DS of the connector component CN (i.e., a right side of the drawing sheet of FIG. 6).

In FIGS. 4 and 5, the pair of frames 31 making up the substrate conveyance path 13 are equipped with a light projector 41 that projects inspection light L having a given width with respect to the vertical direction, so as to encompass both ends of the pair of conveyance belts 33 in their widthwise direction (Y-axis direction) and a light receiver 42 that receives the inspection light L projected by the light projector 41, wherein the light projector 41 and the light receiver 42 are placed within a horizontal in-plane direction (i.e., the Y-axis direction) orthogonal to the direction of conveyance of the substrate Pb (i.e., the X-axis direction) conveyed by the pair of conveyance belts 33. Specifically, in FIG. 5, an upper edge La of the inspection light L is situated at a position above upper surfaces 33a of the respective conveyance belts 33. A lower edge Lb of the inspection light L is situated at a position below lower surfaces 33b of the respective conveyance belts 33.

Therefore, as shown in FIGS. 6(a) and (b), when the component Pt mounted on the substrate Pb conveyed by the pair of conveyance belts 33 include a component (equivalent to the connector component CN in FIG. 6) having a projecting portion H (a hatched area in FIG. 6(a)) projecting from the forward of the substrate Pb (the right side of the paper sheet shown in FIG. 6) of the front end portion Pb of the substrate Pb or the rear end portion PbT2 of the substrate Pb, a change (a drop) will arise in the quantity of inspection light L received by the light receiver 42 if a portion of the inspection light L projected by the light projector 41 is first sectioned by a front end portion PtT of the projecting portion H of the component Pt. From such a change in the quantity of inspection light L received by the light receiver 42, it becomes possible to detect a state in which the front end portion PtT of the projecting portion H of the component Pt mounted on the substrate Pb has reached the inspection light L.

In the meantime, in a case where the component Pt are not mounted on the substrate Pb conveyed by the pair of conveyance belts 33 or where a component having the projecting portion H is not included in the component Pt even when the component Pt are attached, a change (a drop) will arise in the quantity of inspection light L received by the light receiver 42 if a portion of the inspection light L projected by the light projector 41 is first sectioned by the front end portion PbT of the substrate Pb. Accordingly, it is possible to detect, from such a change in the quantity of received light, a state where the front end portion PbT of the substrate Pb has reached the inspection light L.

An operation execution control section 50a of a controller 50 (FIG. 7) provided in each of the component mounting devices 3 controls operation of the conveyance drive motor 34, whereupon operation for conveying and positioning the substrate Pb along the substrate conveyance path 13 is performed. Further, the operation execution control section 50a of the controller 50 controls operation of a component feeder drive section 51 (FIG. 7) made up of an unillustrated actuator, or the like, whereupon each of the component feeders 14 performs operation for feeding the component Pt to the corresponding component feed port 14a.

The operation execution control section 50a of the controller 50 controls operation of a head actuation mechanism drive section 52 (FIG. 7) made up of an unillustrated actuator, whereupon the head actuation mechanism 15 actuates the respective mounting heads 16 within the horizontal plane; namely, actuates the respective X-axis tables 22 with respect to the Y-axis table 21 in the Y-axis direction and actuates the respective movable stages 23 with respect to the X-axis table 22 in the X-axis direction. The operation execution control section 50a of the controller 50 controls operation of a nozzle drive section 53 (FIG. 7) made up of an unillustrated actuator, whereupon the suction nozzles 16a are vertically actuated or turned around the vertical axis with respect to the respective mounting heads 16. Moreover, the operation execution control section 50a of the controller 50 controls operation of a vacuum pressure feed section 54 (FIG. 7) made up of an unillustrated actuator, whereupon the respective suction nozzles 16a perform operation for sucking the component Pt and releasing the thus-sucked component Pt.

Figure 7:
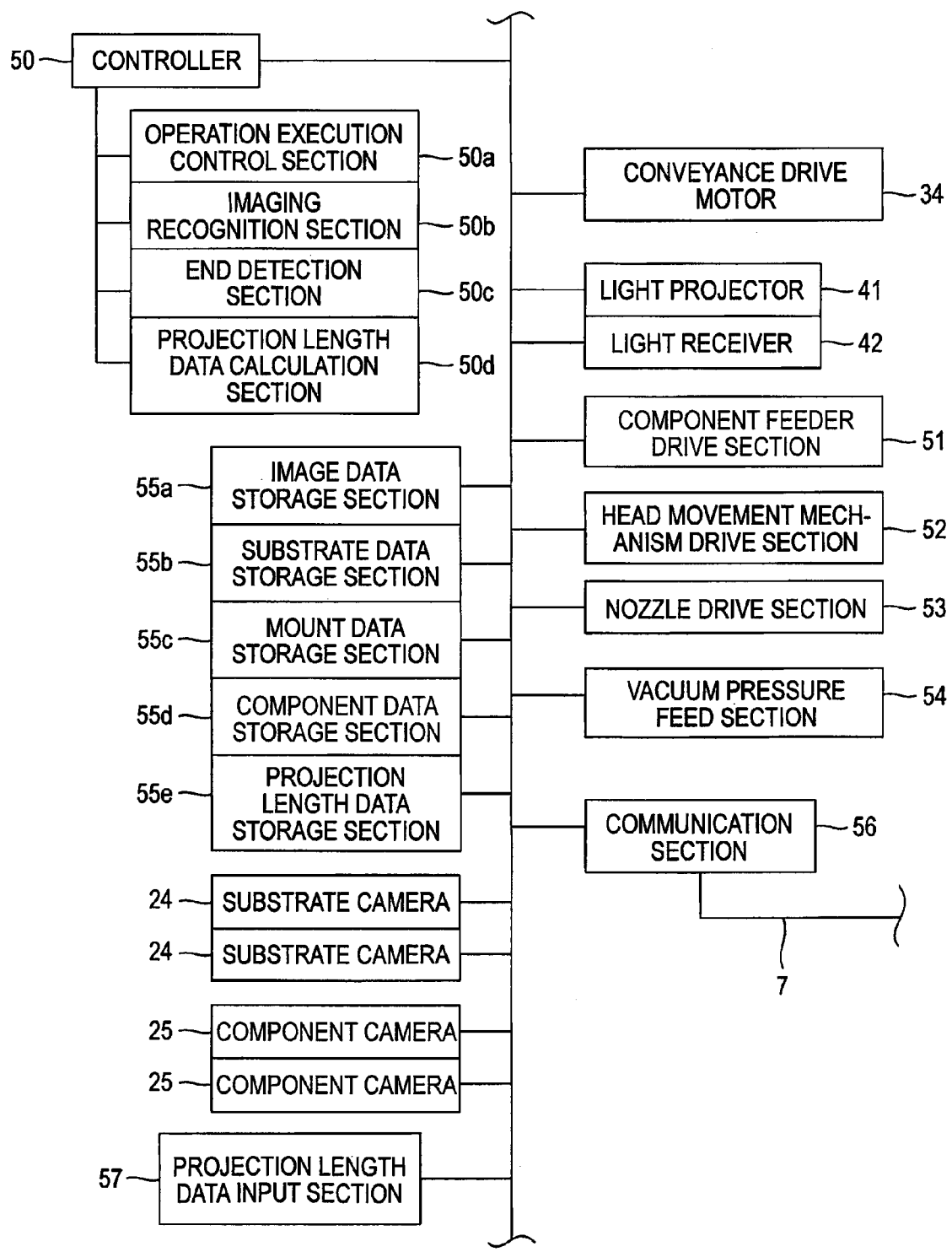
FIG. 7 is a section diagram showing a control system of the component mounting device of the embodiment of the present invention.

The operation execution control section 50a of the controller 50 controls imaging operation of the substrate cameras 24 and operation of the component cameras 25, whereupon the substrate cameras 24 and the component cameras 25 perform imaging operation (FIG. 7). Image data acquired by imaging operation of the substrate cameras 24 and the component cameras 25 are acquired and stored in an image data storage section 55a (FIG. 7), to thus be subjected to image recognition performed by an image recognition section 50b of the controller 50. Moreover, an end detection section 50c of the controller 50 controls light projection operation of the light projector 41 for projecting the inspection light L and detects a change in the quantity of inspection light L received by the light receiver 42, whereupon the light projector 41 and the light receiver 42 detect an end of the substrate Pb in a direction parallel to the substrate conveyance path 13 (i.e., the front end portion PbT or the rear end portion PbT2; and refer to FIG. 17 to be described later for the rear end portion PbT2) or an end of the projecting portion H (i.e., the front end portion PtT or a rear end portion PtT2) projecting outside (forward or backward) from the end of the component Pt mounted on the substrate Pb (i.e., the end of the substrate Pb in a direction parallel to the substrate conveyance path 13).

Figures 8, 9:
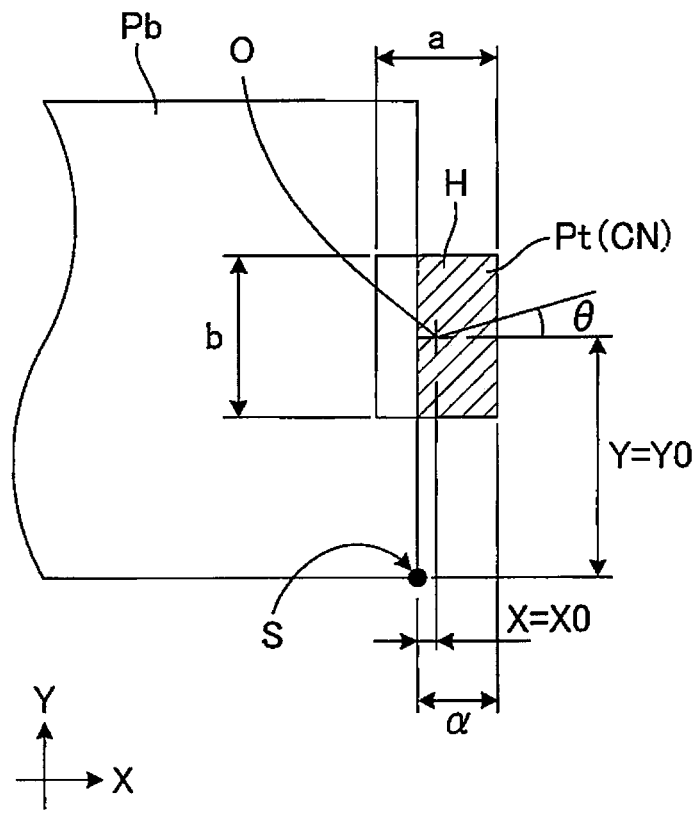
FIG. 8 is a partial plan view of a substrate on which a connector component is mounted by the component mounting device of the embodiment of the present invention.
FIG. 9 is a view showing example data pertaining to a list of projection lengths stored in a projection length data storage section provided in the component mounting device of the embodiment of the present invention.

In FIG. 7, every time the component Pt is mounted on the substrate Pb, a projection length data calculation section 50d provided in each of the component mounting devices 3 calculates a projection length $\alpha$ (see FIGS. 6(a), (b), and FIG. 8) of the component Pt projecting from the end of the substrate Pb in the direction parallel to the substrate conveyance path 13, from substrate data formed from data pertaining to a shape of the substrate Pb stored in a substrate data storage section 55b, mounting data that are stored in a mounting data storage section 55c and that are formed from data pertaining to types of component Pt mounted on each of the substrates Pb, mounting positions on the substrate Pb with reference to a reference position S of the substrate Pb (FIG. 8), and the like, and component data that are stored in a component data storage section 55d and that are formed from data pertaining to outer dimensions of the component Pt of respective types mounted on each of the substrates Pb. Resultantly acquired projection length list data (FIG. 9) are stored in a projection length data storage section 55e. Specifically, in the present embodiment, the projection length data calculation section 50d serves as a projection length data calculation unit that calculates data pertaining to projection lengths of the respective components Pt from data pertaining to mounting positions on the substrate Pb and outer dimensions of respective components Pt mounted on the substrate Pb.

As shown in FIG. 8, for instance, when the component Pt measuring "a" in the X-axis direction and "b" in the Y-axis direction (the connector component CN) is mounted at a mounting angle $\theta=0$ to the substrate with a center O of the component situated at a position of X=X0 in the X-axis direction and Y=Y0 in the Y-axis direction with reference to the reference position S of the substrate Pb, the projection length $\alpha$ of the projecting portion H of the component Pt is determined as $\alpha=0.5a+X0$ by calculation, and the thus-calculated value is written into projection length list data and stored in the projection length data storage section 55e.

Figure 11:
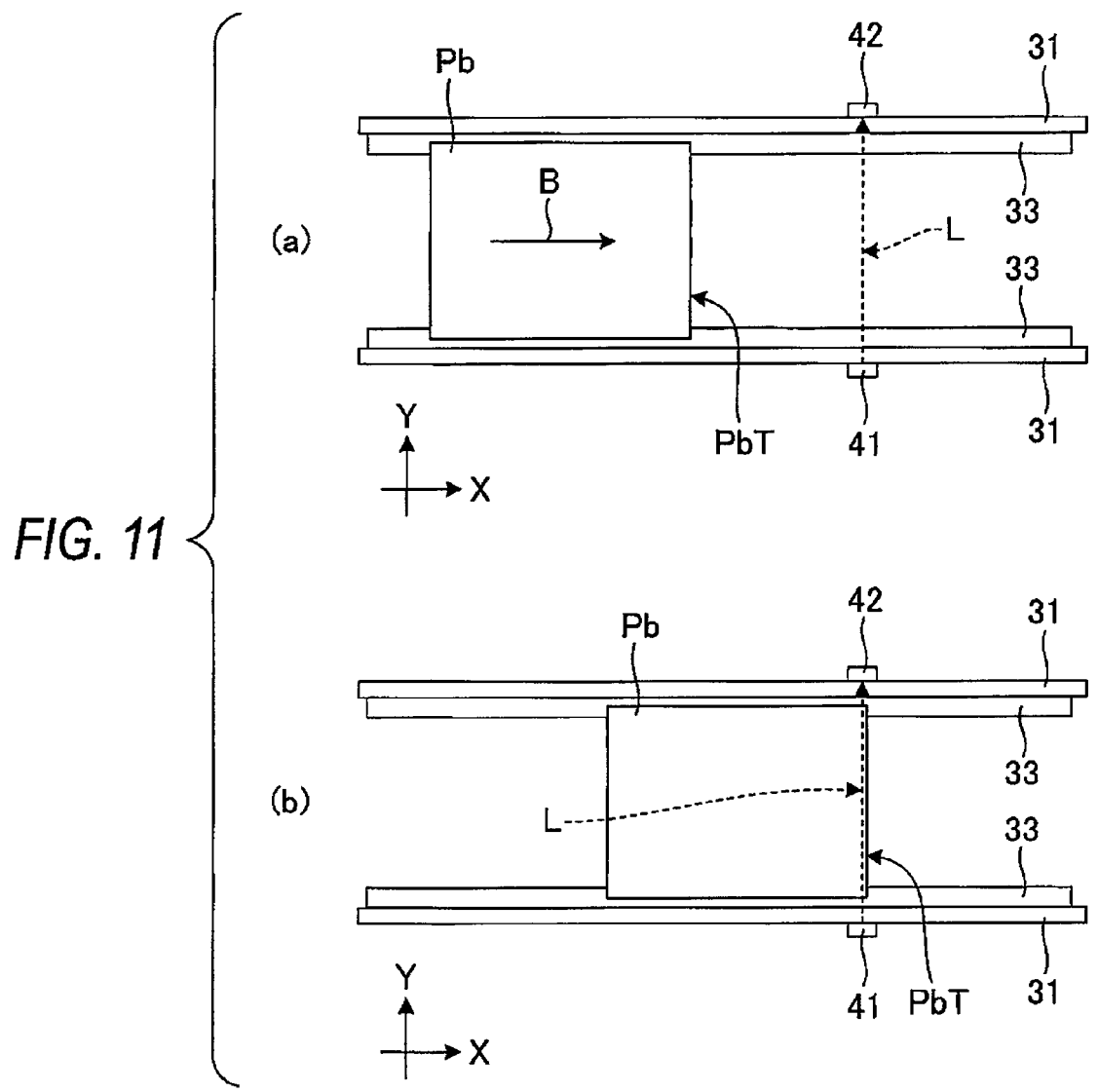
FIGS. 11 (a), (b) are views showing procedures for positioning a substrate by the component mounting device of the embodiment of the present invention.
Figure 12:
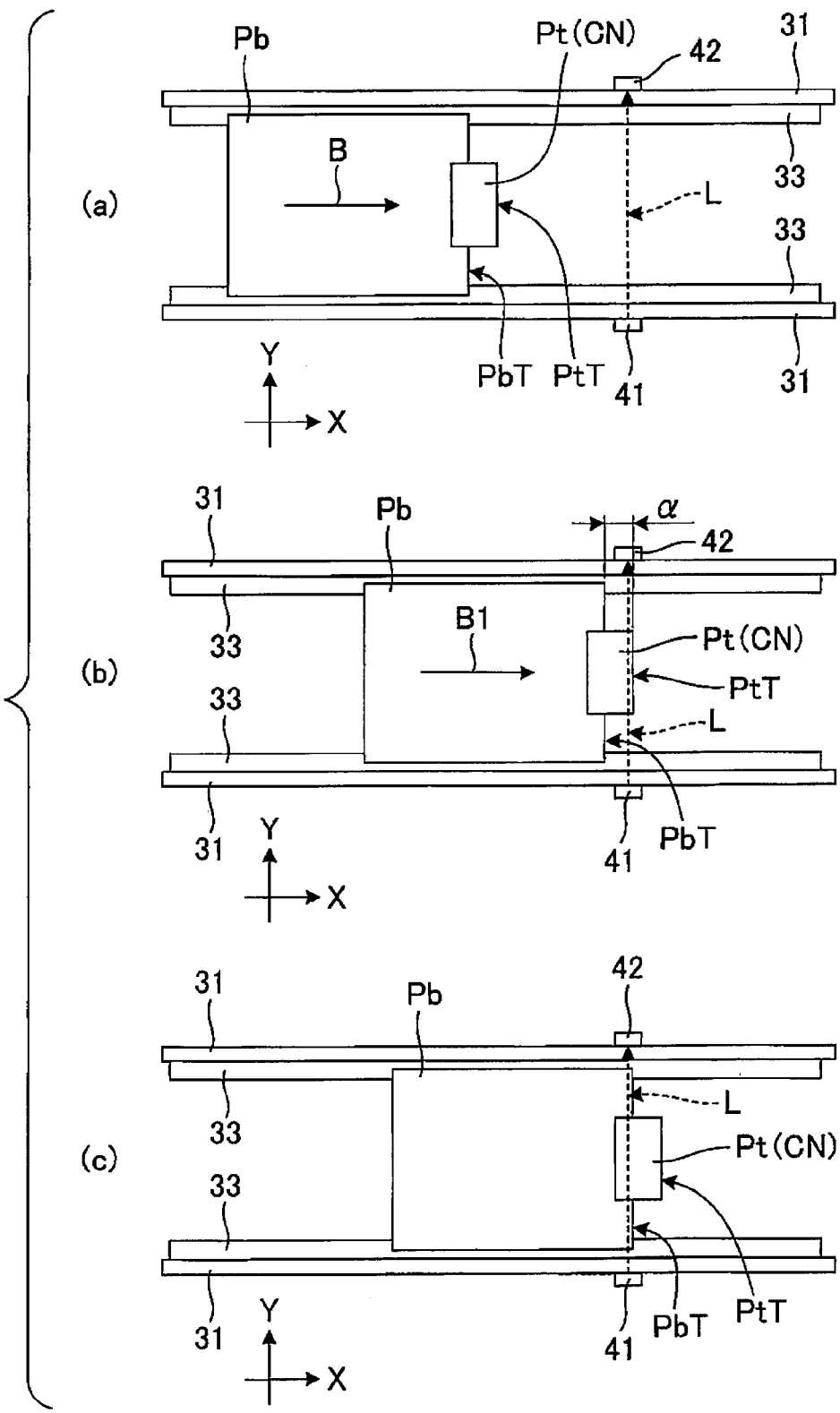
FIGS. 12 (a), (b), (c) are views showing procedures for positioning a substrate by the component mounting device of the embodiment of the present invention.

Explanations are now given to procedures for positioning the substrate Pb to the working position while taking the front end portion Pbt as a reference. The operation execution control section 50a of the controller 50 first controls operation of the conveyance drive motor 34, thereby conveying the substrate Pb received from an upstream apparatus (i.e., the solder printer 2 for the upstream component mounting device 3 or the upstream component mounting device 3 for the downstream component mounting device 3) toward the working location (step ST1 shown in FIG. 10, and refer to arrow B shown in FIG. 11(a) or FIG. 12(a)). The operation execution control section 50a of the controller 50 monitors the quantity of inspection light L received by the light receiver 42. When a change (a decrease in this case) has occurred in the quantity of received light as a result of a portion of the inspection light L projected by the light projector 41 being sectioned by the front end portion Pbt of the substrate Pb or the front end portion PtT of the projecting portion H of the component Pt (the connector component CN) mounted on the substrate Pb (FIG. 11(b) or FIG. 12(b)), the front end portion PbT of the substrate Pb conveyed by the substrate conveyance path 13 in the direction of conveyance of the substrate or the front end portion PtT of the projecting portion H of the component Pt mounted on the substrate Pb is thereby detected to have reached the inspection light L (step ST2 shown in FIG. 10).

Figure 10:
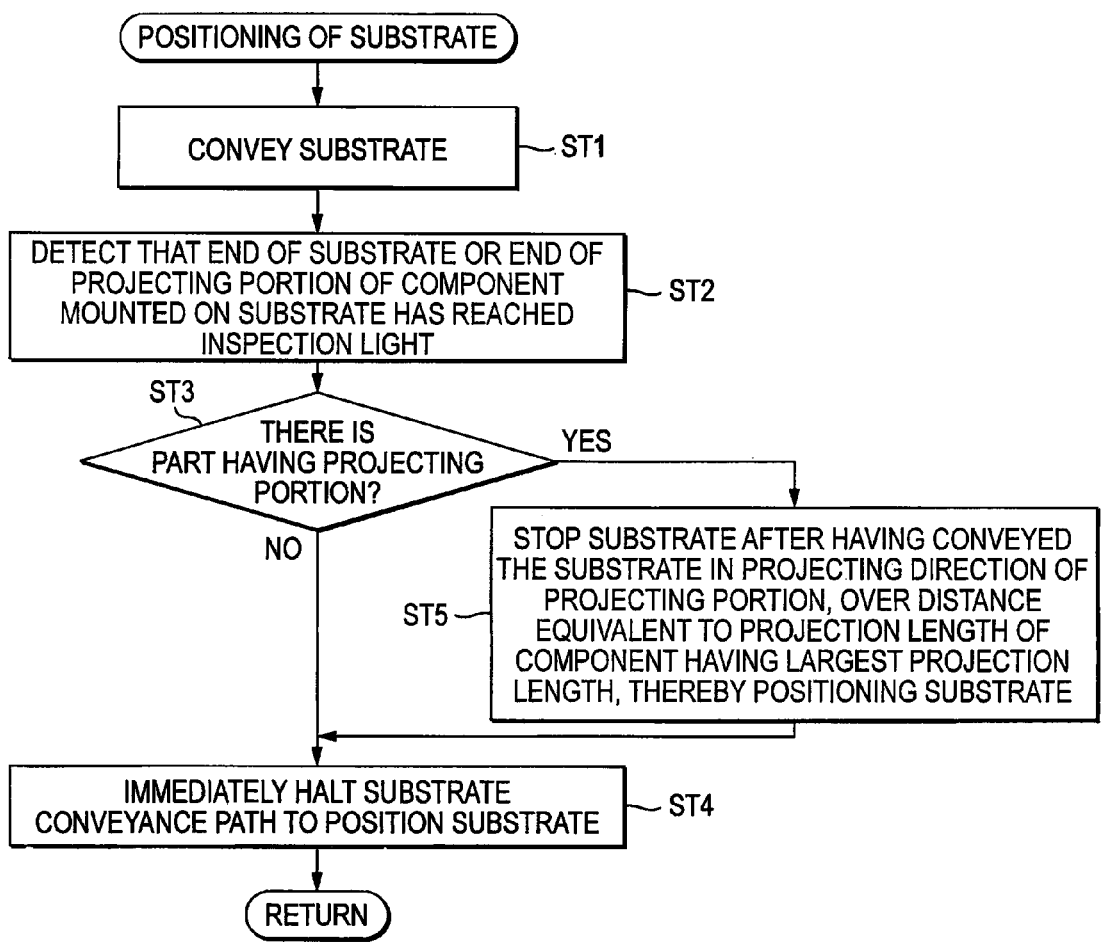
FIG. 10 is a flowchart showing substrate positioning procedures along which the component mounting device of the embodiment of the present invention performs operation.

When the end detection section 50c of the controller 50 detects a state in which the front end portion PbT of the substrate Pb or the front end portion PtT of the projecting portion H of the component Pt mounted on the substrate Pb has reached the inspection light L, the operation execution control section 50a of the controller 50 determines whether or not the component Pt having the forwardly-projecting portion H (namely, the projection length of $\alpha>0$) is mounted on the substrate Pb, by reference to the projection length list data stored in the projection length data storage section 55e (step ST3 shown in FIG. 10). When a result of determination shows that the component Pt having the forwardly-projecting portion H is not at all mounted on the substrate Pb (all of the components Pt assume $\alpha=0$), the front end portion PbT of the substrate Pb is determined to have reached the inspection light L, and operation of the substrate conveyance path 13 (i.e., conveyance of the substrate Pb) is halted immediately, thereby positioning the substrate Pb (step ST4 shown in FIG. 10). In the meantime, when the components Pt having the forwardly-projecting portions H are mounted, the front end portion PtT of the component Pt having the largest forward projection length $\alpha$ is determined to have reached the inspection light L. The substrate Pb is conveyed at low speed in the direction (that means herein a direction of forward movement of the substrate Pb) in which the projecting portion H projects, over a distance equivalent to the projection length $\alpha$ (indicated by arrow B1 shown in FIG. 12(b)). The substrate Pb is then stopped and positioned (step ST5 shown in FIG. 10, and FIG. 12(c)).

When the substrate Pb is positioned, as the working location, at the location where the front end portion PbT of the substrate Pb has reached the inspection light L and even when the components Pt mounted on the substrate Pb project forwardly from the front end portion Pbt of the substrate Pb, the substrate Pb can be correctly positioned at the working location.

Figure 13:
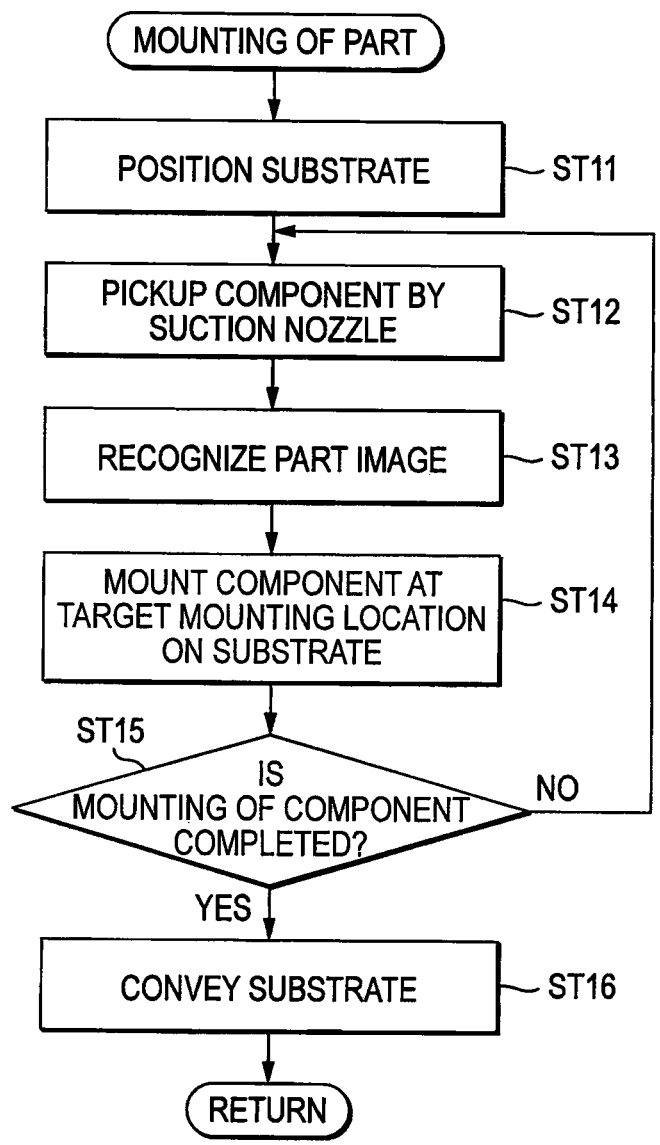
FIG. 13 is a flowchart showing procedures for mounting a component on a substrate by the component mounting device of the embodiment of the present invention.

When there is performed processing pertaining to a step of attaching the components Pt to the substrate Pb conveyed out from the upstream apparatus by the component mounting device 3 of such a configuration (i.e., a step of attaching the components Pt), the operation execution control section 50a of the controller 50 activates the substrate conveyance path 13, thereby receiving the substrate Pb from the upstream apparatus (the solder printer 2 for the upstream component mounting device 3 or the upstream component mounting device 3 for the downstream component mounting device 3), conveys (carries) the thus-received substrate in the X-axis direction, thereby positioning the substrate at the working location in the foregoing manner (step ST11 shown in FIG. 13).

The substrate Pb on which the components Pt are not mounted is sent from the solder printer 2 and conveyed into the upstream component mounting device 3. Consequently, when the front end portion PbT of the substrate Pb is detected to have reached the inspection light L, conveyance of the substrate Pb is stopped. In the meantime, the substrate Pb onto which the upstream component mounting device 3 have mounted the component Pt is conveyed into the downstream component mounting device 3. For this reason, when the component Pt mounted on the substrate Pb do not include any component Pt having the portion H that has projected forwardly from the front end portion PbT of the substrate Pb, conveyance of the substrate Pb is stopped when the front end portion PbT of the substrate Pb is detected to have reached the inspection light L. When the component Pt mounted on the substrate Pb include the component Pt having the portions H that project forwardly from the front end portion PbT of the substrate Pb, the substrate is caused to proceed at low speed over a distance equivalent to the projection length α of the projecting portion H at which the inspection light L has reached after the front end portion PtT of the projecting portion H of the component Pt having the largest projection length α has reached the inspection light L (whereby the front end portion PbT of the substrate Pb reaches the inspection light L), whereupon conveyance of the substrate Pb is stopped.

During positioning of the substrate Pb, the operation execution control section 50*a* of the controller 50 moves the substrate camera 24 (the mounting head 16) to an elevated position above a substrate mark (not shown) provided on the substrate Pb, thereby capturing an image of the substrate mark. The image recognition section 50*b* subjects the thus-acquired image to image recognition, thereby calculating positional displacement of the substrate Pb (positional displacement from a normal working location of the substrate Pb).

After having finished positioning the substrate Pb to the working location and calculating positional displacement of the substrate Pb, the operation execution control section 50*a* of the controller 50 repeats operation for placing the component Pt on the substrate Pb (component mounting operation). During component mounting operation, the operation execution control section 50*a* of the controller 50 first moves the mounting head 16 to a position above any component feeder 14, thereby positioning the corresponding suction nozzle 16*a* at a location immediately above the corresponding component feed port 14*a* of the component feeder 14. The suction nozzle 16*a* is lowered with respect to the mounting head 16, to thus contact the component Pt fed to the respective component feed port 14*a*. When the suction nozzle 16*a* has contacted the component Pt, the operation execution control section 50*a* of the controller 50 feeds vacuum pressure into the suction nozzles 16*a*, to thus let the suction nozzle 16*a* suck the component Pt. Subsequently, the suction nozzle 16*a* is elevated. The component Pt is thus picked up by the corresponding suction nozzle 16*a* (step ST12 shown in FIG. 13).

The operation execution control section 50*a* of the controller 50 performs operation for letting the suction nozzle 16*a* pick up the component Pt in connection with each of the suction nozzles 16*a* provided in the mounting head 16. Subsequently, the operation execution control section lets the component Pt sucked by the respective suction nozzles 16*a* sequentially pass over the component camera 25 while moving the mounting head 16 to the substrate Pb. The operation execution control section then causes the component camera 25 to capture an image of each of the component Pt and the image data storage section 55*a* to capture image data pertaining to the respective component Pt captured by the component camera 25, and the image recognition section 50*b* performs image recognition (step ST13 shown in FIG. 13). During recognition of the image of the component Pt, there is performed an inspection about presence or absence of an anomaly (deformation, a defect, or the like) in the component Pt, and positional displacement (suction displacement) of the component Pt from the suction nozzle 16*a* is calculated.

The operation execution control section 50*a* of the controller 50 moves the mounting head 16 to the position above the substrate Pb, places the component Pt sucked by the corresponding suction nozzle 16*a* to a location immediately above a target mounting location on the substrate Pb (the target mounting location is printed with solder by the solder printer 2), lowers the suction nozzle 16*a* with respect to the mounting head 16, thereby bringing the component Pt into contact with the corresponding target mounting location. The operation execution control section 50*a* of the controller 50 shuts off a feed of vacuum pressure to the respective suction nozzles 16*a* when the component Pt have contacted the upper surface of the substrate Pb, lets the respective component Pt depart from the suction nozzle 16*a*, and elevates the suction nozzle 16*a*. The component Pt is thereby mounted on the substrate Pb (step ST14 shown in FIG. 13). When the component Pt is mounted on the substrate Pb, the position of the suction nozzle 16*a* with respect to the substrate Pb is corrected (positional correction includes rotational correction), so as to make a correction to positional displacement of the substrate Pb calculated in step ST11 and suction displacement of the respective component Pt calculated in step ST13.

The operation execution control section 50*a* of the controller 50 performs component mounting operation for mounting the component Pt sucked by the suction nozzle 16*a* to the corresponding target mounting position on the substrate Pb in connection with the respective suction nozzles 16*a* provided in the mounting head 16. Then, the operation execution control section 50*a* determines whether or not all of the components have finished being mounted on the substrate Pb to which the components Pt are now mounted (step ST15 in FIG. 13). When not all of the components have finished being mounted, processing returns to step ST12. Component mounting operation is performed in connection with the components Pt that are not yet mounted on the substrate Pb. When all of the components have finished being mounted, the substrate conveyance path 13 is activated, to thus convey the substrate Pb to a downstream apparatus (the downstream component mounting device 3 for the upstream component mounting device 3 or the inspection device 4 for the downstream component mounting device 3 (ST16 shown in FIG. 13).

The substrate Pb thus conveyed out from the component mounting device 3 is conveyed into the other component mounting device 3 or the inspection device 4 that is situated downstream with respect to the component mounting device. In the case of the component mounting device 3, the components Pt are mounted on the substrate Pb. In the case of the inspection device 4, the components Pt mounted on the substrate Pb are inspected. The inspection device 4 conveys the substrate Pb having finished undergoing inspection to the reflow furnace 5. The substrate Pb conveyed into the reflow furnace 5 is subjected to solder reflow.

As mentioned above, the component mounting system 1 of the present embodiment is built by arranging a plurality of component mounting devices 3 (two component mounting devices in the embodiment) side by side and is configured so as to sequentially pass the substrate Pb among the plurality of component mounting devices 3 and share operation for mounting the components Pt to the substrate Pb among the respective component mounting devices 3.

During conveyance of the substrate Pb to the outside, the controller 50 of the upstream component mounting device 3 delivers, by a communication section 56 (FIG. 7), the projection length list data prepared in the process of mounting the components Pt to a communication section 56 of the controller 50 of the downstream component mounting device 3. The downstream communication section 56 positions the substrate Pb according to the projection length list data delivered from the upstream component mounting device 3 via the host computer 7. Further, the downstream communication section 56 writes the projection length α of the component Pt to the projection length list data every time the component Pt is mounted on the substrate Pb.

Figure 14:
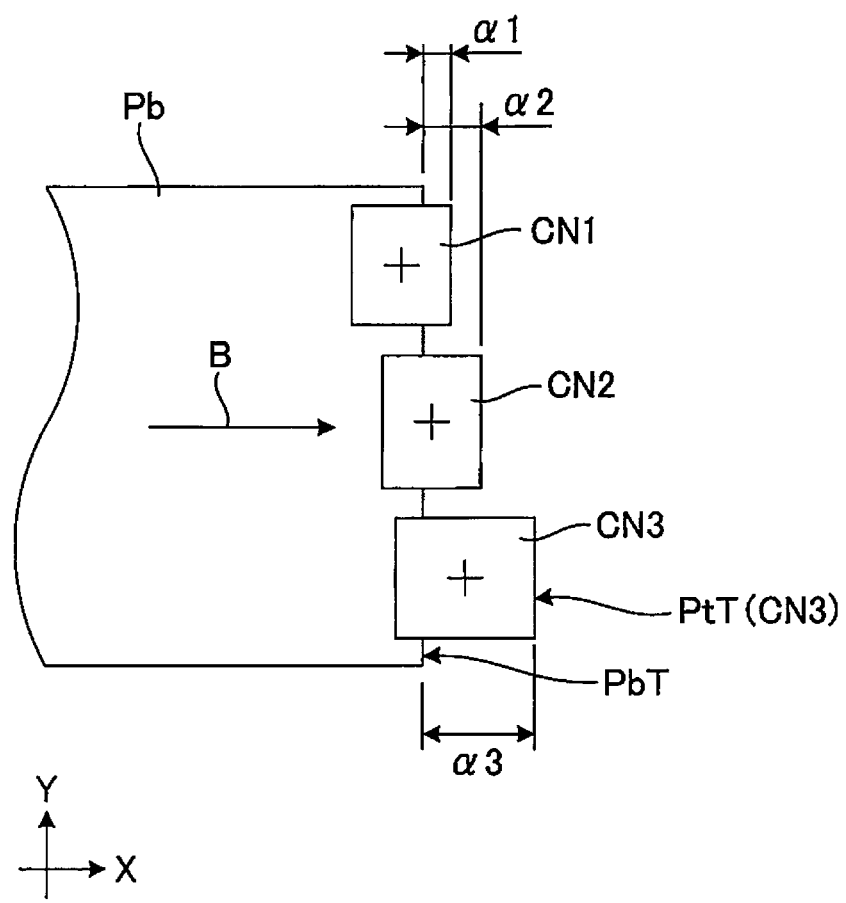
FIG. 14 is a plan view of a substrate on which components are mounted by the component mounting device of the embodiment of the present invention.

As shown in; for instance, FIG. 14, when the three connector components CN1, CN2, and CN3 are mounted on the front end portion PbT of the substrate Pb and when the projection lengths α of the three connector components CN1, CN2, and CN3 are respectively defined as projection lengths α1, α2, and α3 (α1<α2<α3), a front end portion PtT (CN3) of the connector component CN3 having the greatest projection length α among the three connector components CN1, CN2, and CN3 first comes to reach the inspection light L. In this case, the substrate Pb is subsequently conveyed over a distance equivalent to the projection length α3 of the connector component CN3 and then positioned. Accordingly, what is required to position the substrate Pb is only data pertaining to the projection length α3 of the connector component CN3. Data pertaining to the projection length α1 of the connector component CN1 and data pertaining to the projection length α2 of the connector component CN2 become substantially unnecessary. Consequently, the upstream component mounting device 3 may also deliver only the data pertaining to the projection length α of the component Pt having the largest projection length to the downstream component mounting device 3.

Every time the component Pt is mounted on the substrate Pb, the component mounting device 3 is arranged so as to write data pertaining to the projection length α of the component Pt from the substrate Pb into the projection length list data. By reference to the projection length list data stored in the projection length data storage section 55e, the operation execution control section 50a of the controller 50 can grasp, in real time, information about a projection length of the component Pt currently mounted on the substrate Pb in the middle of performance of processing pertaining to the process of mounting the component Pt. Therefore, even when the operator once pulled the substrate Pb from the substrate conveyance path 13 for any reason in the middle of operation for mounting the component Pt and again loaded the substrate into the substrate conveyance path, the substrate can be again correctly positioned in consideration of the projection length α if the component Pt having the projecting portion H is mounted on the substrate Pb.

Figure 15:
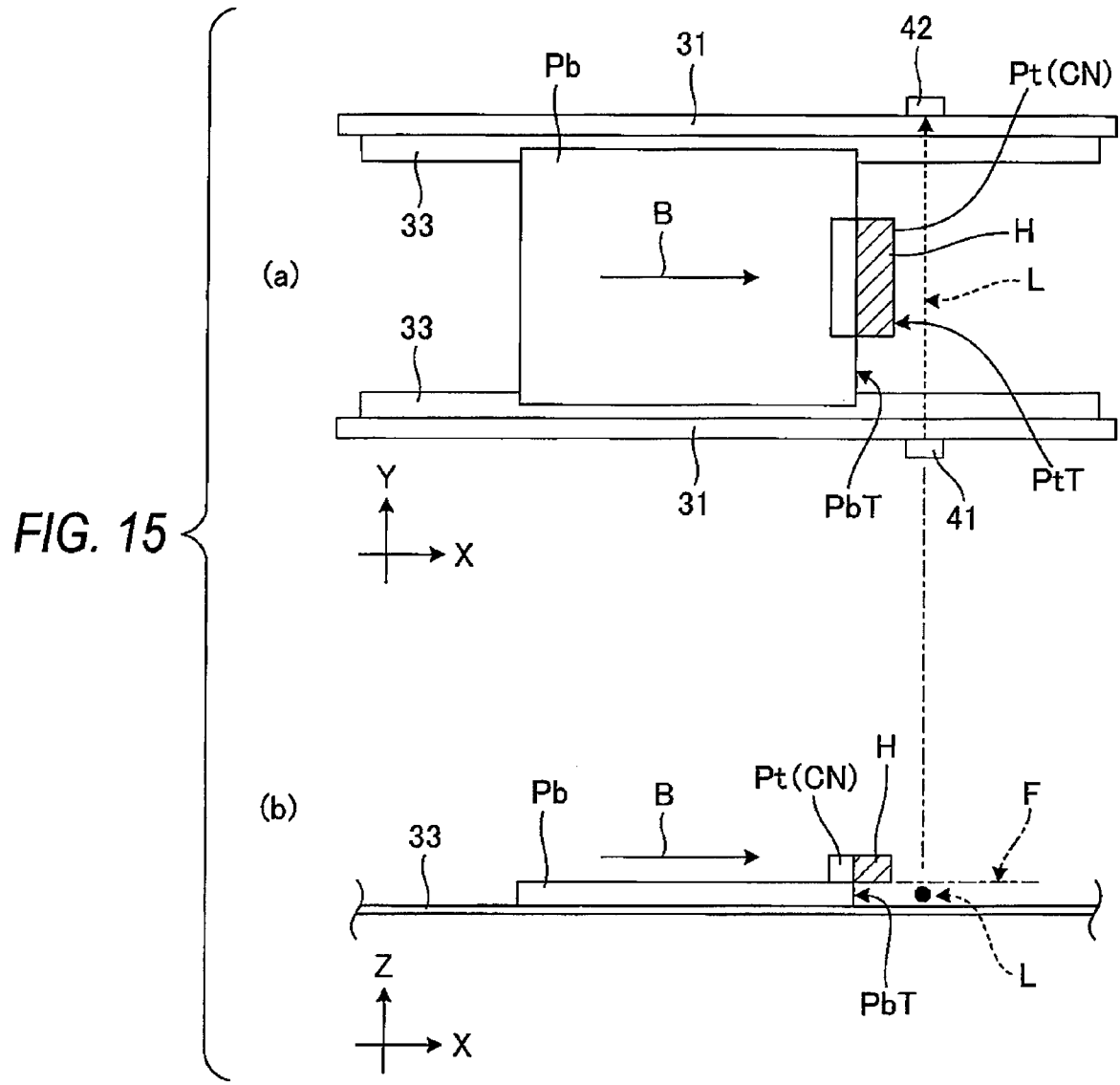
FIG. 15 (a) is a plan view showing an example way of letting inspection light travel in the component mounting device of the embodiment of the present invention, and FIG. 15 (b) is a side view of the same.

Incidentally, in the above descriptions, the inspection light L is stated to have a given width in the vertical direction so as to encompass both ends of the pair of conveyance belts 33 in their widthwise direction (i.e., the Y-axis direction) within the horizontal in-plane direction (i.e., the Y-axis direction) orthogonal to the direction of conveyance of the substrate Pb conveyed by the pair of conveyance belts 33 (i.e., the X-axis direction). Therefore, when either the front end portion PbT of the substrate Pb conveyed by the conveyance belt 33 or the front end portion PtT of the projecting portion H projecting from the component Pt mounted on the substrate Pb has reached the inspection light L and when the front end portion PbT of the substrate Pb has first reached the inspection light L, conveyance of the substrate Pb is stopped at this point in time, whereby the substrate Pb can be positioned at the working location. When the front end portion PtT of the projecting portion H of the component Pt mounted on the substrate Pb has first reached the inspection light L, the substrate Pb is later caused to further proceed over a distance equivalent to the projection length α of the projecting portion H, whereby the substrate Pb can be positioned at the working location. However, the inspection light L does not necessarily have a given width in the vertical direction so as to encompass both ends of the pair of conveyance belts 33 in their widthwise direction. As shown in FIGS. 15(a) and (b) the essential requirement is that the inspection light pass through at least an elevated position at the height of the front end portion PbT of the substrate Pb conveyed by the pair of conveyance belts 33 in the Y-axis direction.

However, in this case, when the inspection light L passes, in the Y-axis direction, through an area lower than a lower surface F of the portion H projecting forwardly from the front end portion PbT of the substrate Pb, the front end portion PtT of the projecting portion H will not reach the inspection light L even if the component Pt mounted on the substrate Pb has the projecting portion H. Consequently, in a case where the projecting portion H of the component Pt having the largest projection length α does not reach the inspection light L, the substrate Pb will proceed over a distance equivalent to the projection length α of the component Pt that has the largest projection length α and that has not reached the inspection light L if the front end portion PbT of the substrate Pb or the front end portion PtT of the projecting portion H of the other component Pt has reached the inspection light L. Instead, this will make it impossible to correctly position the substrate Pb.

For these reasons, the component mounting device 3 of the present embodiment has a projection length data input section 57 shown in FIG. 7. The projection length data input section 57 enables manual input of the projection length list data. For instance, a value of 0 is input for (or a correction including a value of 0 is made to) a calculated projection length, or a flag for making the value of calculated α invalid is set, in connection with the projection length list data (FIG. 9) calculated by the projection length data calculation section 50d, whereby the data pertaining to the projection length α can be canceled (ignored) in relation to the component Pt that will not reach the inspection light L. Even when the component Pt mounted on the substrate Pb include the projecting portion H projecting forwardly from the front end portion PbT of the substrate Pb, the value of the projection length α is corrected to zero in connection with component Pt that will not reach the inspection light L. When the front end portion PbT of the substrate Pb has reached the inspection light L, conveyance of the substrate Pb is subsequently stopped and the substrate Pb can be positioned at a correct location. As mentioned above, in the embodiment, the projection length data input section 57 acts as a projection length data input unit that inputs projection length data for each component to long as projection length data are input in relation to each of the components Pt from the projection length data input section 57, there will be obviated the process in which the projection length data calculation section 50d calculates the data pertaining to the projection length α of each component Pt.

In the above descriptions, the substrate Pb is positioned by detecting that the front end portion PbT of the substrate Pb which is conveyed by the substrate conveyance path 13 and which is achieved in the direction of conveyance of the substrate Pb (i.e., the X-axis direction) or the front end portion PtT of the projecting portion H projecting forwardly from the front end portion PbT, of the component Pt mounted on the substrate Pb, which is achieved in the direction of conveyance of the substrate Pb has reached the inspection light L. In place of such a configuration, the substrate Pb can also be positioned by detecting that a rear end portion PbT2 of the substrate Pb which is conveyed by the substrate conveyance path 13 and which is achieved in the direction of conveyance of the substrate Pb or a rear end portion PtT2 of the projecting portion H projecting backwardly from the rear end portion PbT2 of the component Pt mounted on the substrate Pb, which is achieved in the direction of conveyance of the substrate Pb has reached the inspection light L.

Figure 16:
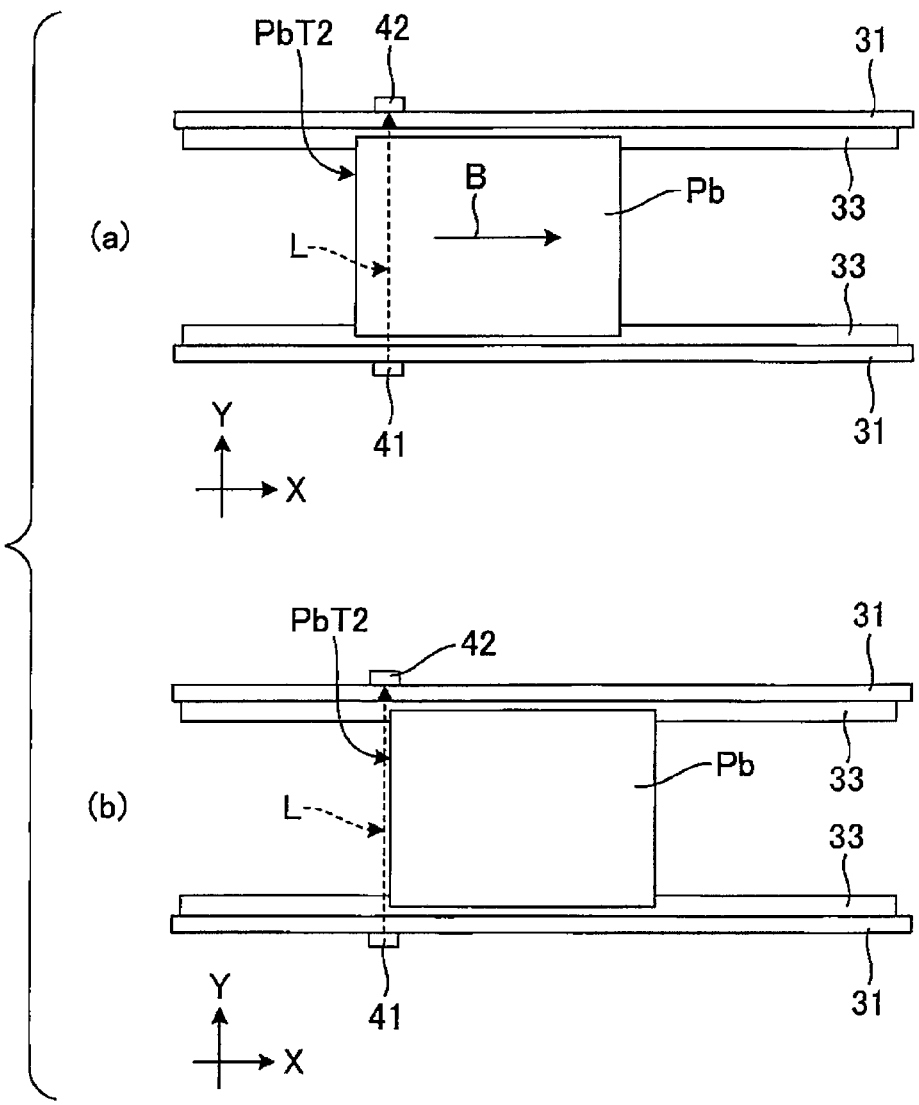
FIGS. 16 (a), (b) are views showing procedures for positioning a substrate by the component mounting device of the embodiment of the present invention.
Figure 17:
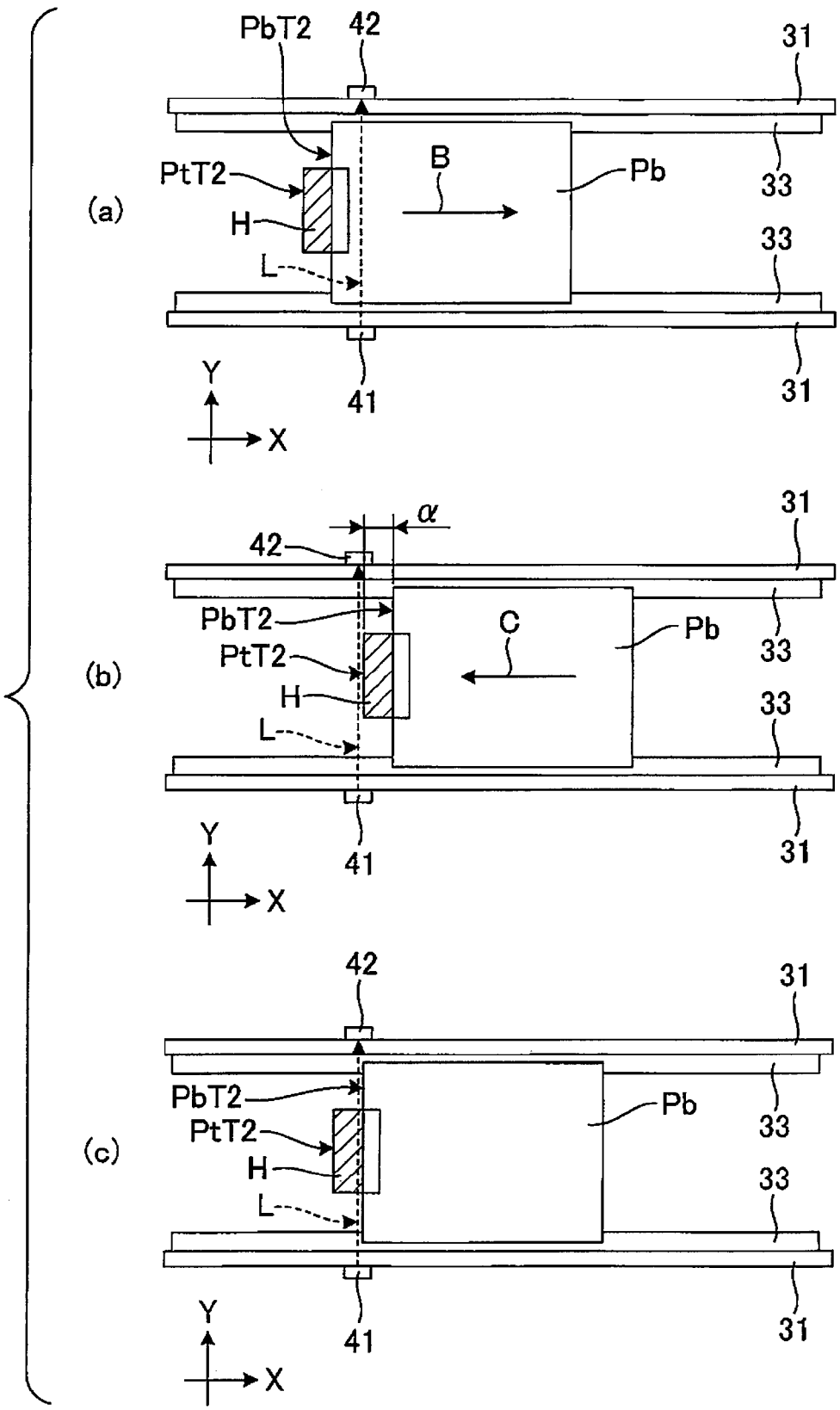
FIGS. 17 (a), (b), (c) are views showing procedures for positioning a substrate by the component mounting device of the embodiment of the present invention.

Specifically, as shown in FIGS. 16 and 17, the operation execution control section 50a of the controller 50 conveys the substrate Pb received from the upstream apparatus (i.e., the solder printer 2 for the upstream component mounting device 3 or the upstream component mounting device 3 for the downstream component mounting device 3) toward the working location during positioning of the substrate Pb (see arrow B shown in FIG. 16(a) or FIG. 17(a)). When the rear end portion PbT2 of the substrate Pb or the rear end portion PtT2 of the projecting portion H projecting backwardly from the component Pt (the connector component CN) mounted on the substrate Pb has reached a location where the inspection light L projected by the light projector 41 is released from a state in which a portion of the inspection light has been sectioned thus far (FIG. 16(b) or FIG. 17(b)), the end detection section 50c of the controller 50 detects that the rear end portion PbT2 of the substrate Pb or the rear end portion PtT2 of the projecting portion H projecting backwardly from the component Pt mounted on the substrate Pb has reached the inspection light L, from the fact that the amount of inspection light L received by the light receiver 42 changes (increases in the embodiment).

When the end detection section 50c detected that the rear end portion PbT2 of the substrate Pb or the rear end portion PtT2 of the backwardly projecting portion H of the component Pt mounted on the substrate Pb has reached the inspection light L, the operation execution control section 50a of the controller 50 determines, by reference to the projection length list data stored in the projection length data storage section 55e, whether or not the component Pt having the projecting portion H (a projection length is $\alpha$>0) projecting backwardly from the substrate Pb is mounted on the substrate Pb (corresponding to step ST3 shown in FIG. 10). As a consequence, if the component Pt having the backwardly projecting portion H is not at all mounted on the substrate Pb (when all of the components Pt have $\alpha$=0), the rear end portion PbT2 of the substrate Pb is determined to have reached the inspection light L, whereupon operation of the substrate conveyance path 13 (i.e., conveyance of the substrate Pb) is immediately stopped, and the substrate Pb is positioned (corresponding to step ST4 shown in FIG. 10). In the meantime, when the component Pt having the backwardly-projecting portions H are mounted, the rear end portion PtT2 of the component Pt having the largest backward projection length $\alpha$ is assumed to have reached the inspection light L. The substrate Pb is conveyed at low speed in the direction where the projecting portion H projects (a receding direction of the substrate Pb) over a distance equivalent to the projection length $\alpha$ (as designated by arrow C shown in FIG. 17(b)). Conveyance of the substrate Pb is then halted, and the substrate Pb is positioned (corresponding to step ST5 shown in FIG. 10, and FIG. 17(c)).

In a case where the substrate Pb is positioned, as a working location, at a location where the rear end portion PbT2 of the substrate Pb has reached the inspection light L and even when the component Pt mounted on the substrate Pb backwardly projects from the rear end portion PbT2 of the substrate Pb, the substrate Pb can thereby be correctly positioned at the working location.

Figure 18:
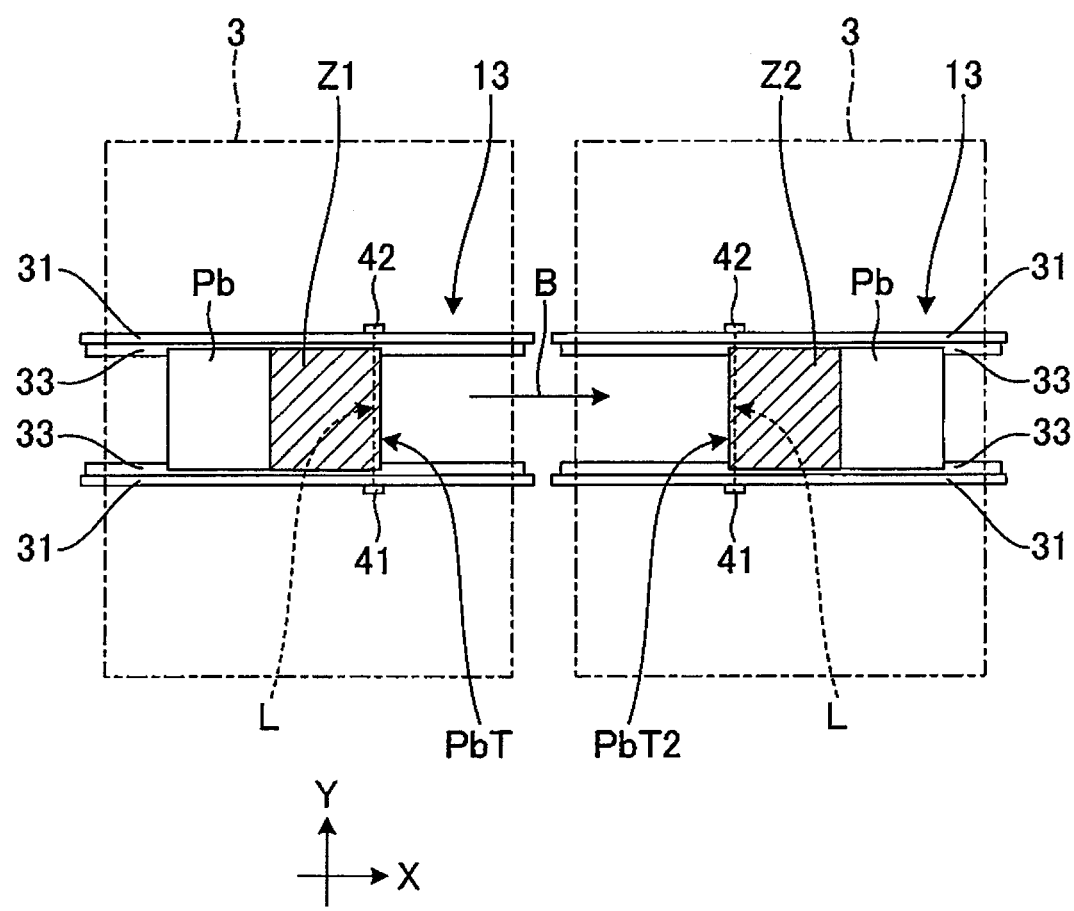
FIG. 18 is a partial plan view of two component mounting devices of the embodiment of the present invention.

As mentioned above, there is adopted the aforementioned configuration for positioning the substrate Pb by detecting a state in which the rear end portion PbT2 of the substrate Pb or the rear end portion PtT2 of the backwardly-projecting portion H of the component Pt mounted on the substrate Pb has reached the inspection light L. There is additionally adopted the configuration for positioning the substrate Pb by detecting a state in which the front end portion PbT of the substrate Pb or the front end portion PtT of the forwardly projecting portion H of the component Pt mounted on the substrate Pb has reached the inspection light L. As shown in FIG. 18, it consequently becomes possible to perform the following operation. Specifically, in relation to a substrate Pb that is large in the direction of conveyance of the substrate Pb (in the X-axis direction), an area on the substrate Pb on which the components Pt are to be mounted is divided into two smaller front and rear areas. The two component mounting devices 3; namely, one on the upstream side (on the left side of the drawing sheet) and the other on the downstream side (on the right side of the drawing sheet), perform operation for mounting the components Pt in the respective mounting areas (a front area Z1 and a rear area Z2) in a shared manner. FIG. 18 shows an embodiment in which the upstream component mounting device 3 performs processing pertaining to a step of mounting the components Pt on the front area Z1 of the substrate Pb after having positioned the substrate Pb with reference to the front end portion PbT of the substrate Pb and in which the downstream component mounting device 3 performs processing pertaining to a step of mounting the components Pt on the rear area Z2 of the substrate Pb after having positioned the substrate Pb with reference to the rear end portion PbT2 of the substrate Pb.

As mentioned above, the component mounting device 3 of the present embodiment comprises the substrate conveyance path 13 that conveys the substrate Pb while supporting the same from below; the light projector 41 that projects inspection light in a direction orthogonal to a direction of conveyance of the substrate Pb (the X-axis direction) by the substrate conveyance path 13; the light receiver 42 that receives the inspection light L projected by the light projector 41; the end detection portion 50c of the controller 50 serving as an end detection unit that, according to a change in the amount of inspection light L received by the light receiver 42, detects a state in which the end (the front end portion PbT or the rear end portion PbT2) of the substrate Pb conveyed by the substrate conveyance path 13 in the direction parallel to the substrate conveyance path 13 or the end of (the front end portion PtT or the rear end portion PbT2) the portion H projecting outwardly (forwardly or backwardly) of the end (the front end portion PbT or the rear end portion PbT2) of the component Pt mounted on the substrate Pb in the direction parallel to the substrate conveyance path 13 has reached the inspection light L; the operation execution control section 50a of the controller 50 serving as a substrate positioning control unit that immediately halts operation of the substrate conveyance path 13 when the end detection section 50c of the controller 50 detects that the end of the substrate Pb has reached the inspection light L or that, when the end detection section detects that the end of the projecting portion H of the component Pt mounted on the substrate Pb has reached the inspection light L, activates the substrate conveyance path 13 such that the substrate Pb moves in the projecting direction of the projecting portion over a distance equivalent to a projection length α of the projecting portion H reached the inspection light L and subsequently stops the substrate conveyance path, thereby positioning the substrate Pb; and the mounting head 16 serving as a mounting section that mounts the components Pt on the substrate Pb positioned by the operation execution control section 50a of the controller 50.

A component mounting method of the embodiment comprises a substrate conveyance step of conveying the substrate Pb by the substrate conveyance path 13 while supporting the same from both sides; a substrate positioning step (steps ST2 to ST5) of immediately halting operation of the substrate conveyance path 13 when the end (the front end portion PbT or the rear end portion PbT2) of the substrate Pb achieved in the direction parallel to the substrate conveyance path 13 is detected to have reached the inspection light L projected in the direction orthogonal to the direction of conveyance of the substrate Pb (the X-axis direction) or, when the end (the front end portion PtT or the rear end portion PtT2) of the projecting portion H of the component Pt on the substrate Pb projecting outwardly (forwardly or backwardly) from the end (the front end portion PbT or the rear end portion PbT2) of the substrate Pb in the direction parallel to the substrate conveyance path 13 is detected to have reached the inspection light L, activating the substrate conveyance path 13 such that the substrate Pb moves in the projecting direction of the projecting portion H over a distance equivalent to a projection length α of the projecting portion H reached the inspection light L and subsequently halting the substrate conveyance path 13, thereby positioning the substrate Pb; and a mounting step (the step ST14) of mounting the components Pt on the thus-positioned substrate Pb.

As mentioned above, in the component mounting device 3 (under the component mounting method) of the embodiment, when the end (the front end portion PbT or the rear end portion PbT2) of the substrate Pb conveyed by the substrate conveyance path 13 in a direction parallel to the substrate conveyance path 13 (the X-axis direction) is detected to have reached the inspection light L, operation of the substrate conveyance path 13 is immediately halted. However, when the end (the front end portion PtT or the rear end portion PtT2) of the projecting portion H of the component Pt mounted on the substrate Pb is detected to have reached the inspection light L, the substrate conveyance path 13 is halted after having been activated such that the substrate Pb moves in the projecting direction of the projecting portion H projects over a distance equivalent to the projection length α of the projecting portion H reached the inspection light L. Therefore, even when the component Pt mounted on the substrate Pb is mounted so as to project out of the end (the front end portion PbT or the rear end portion PbT2) of the substrate Pb in the direction parallel to the substrate conveyance path 13, the component Pt can be mounted while the substrate Pb is positioned at the target position.

The component mounting system 1 of the embodiment is built by arranging the plurality of component mounting devices 3 side by side, the substrate Pb is sequentially passed among the plurality of component mounting devices 3. The respective component mounting devices 3 mount the components Pt on the substrate Pb in a shared manner. Projection length data pertaining to the substrate Pb on which the upstream component mounting device 3 has mounted the components Pt are delivered to the downstream component mounting device 3. Accordingly, the essential requirement for the downstream component mounting device 3 is to control positioning of the substrate Pb according to the data delivered from the upstream component mounting device 3. Since it is possible to accurately position the substrate Pb and for the plurality of component mounting devices 3 to mount the components Pt in a shared manner, a percentage of non-defective mounting board can be enhanced.

Although the embodiment of the present invention has been described thus far, the present invention is not limited to the aforementioned embodiment. For instance, in the foregoing embodiment the inspection light L has been described as being projected in the horizontal in-plane direction (i.e., the Y-axis direction) orthogonal to the direction of conveyance of the substrate Pb by the pair of conveyance belts 33 (the X-axis direction), the essential requirement for the inspection light L is to be projected in the direction orthogonal to the direction of conveyance of the substrate Pb by the substrate conveyance path 13. The inspection light L is not necessarily be projected in the horizontal in-plane direction. Therefore, the inspection light L can be; for instance, light projected in a direction perpendicular to the substrate Pb being conveyed. In this case, however, even when the components Pt mounted on the substrate Pb include the projecting portion H projecting from the end of the substrate Pb in the direction of conveyance of the substrate Pb, the end of the projecting portion H does not necessarily reach the inspection light L. However, as mentioned above, such a situation can be addressed by performing input operation for canceling the data pertaining to the projection length α in the projection length data input section 57, and an advantage similar to that yielded in the foregoing case can be yielded.

Although the present invention has been described in detail by reference to the specific embodiment, it is manifest to those skilled in the art that the present invention be susceptible to various alterations or modifications without departing from the spirit and scope of the present invention.

The present patent application is based on Japanese Patent Application (JP-A-2009-245135) filed on Oct. 26, 2009, the entire subject matter of which is incorporated herein by reference.

INDUSTRIAL APPLICABILITY

There are provided a component mounting device, a component mounting system, and a component mounting method that, even when component mounted on a substrate are disposed so as to project outside from an end of the substrate in a direction parallel to a substrate conveyance path, make it possible to correctly position the substrate at a working location.

DESCRIPTIONS OF THE REFERENCE NUMERALS AND SYMBOLS

1 COMPONENT MOUNTING SYSTEM
3 COMPONENT MOUNTING DEVICE
13 SUBSTRATE CONVEYANCE PATH
16 MOUNTING HEAD (MOUNTING SECTION)
41 LIGHT PROJECTOR
42 LIGHT RECEIVER
50a OPERATION EXECUTION CONTROL SECTION (SUBSTRATE POSITIONING CONTROL UNIT)
50d PROJECTION LENGTH DATA CALCULATION SECTION (PROJECTION LENGTH CALCULATION UNIT)

57 PROJECTION LENGTH DATA INPUT SECTION (PROJECTION LENGTH DATA INPUT UNIT)
L INSPECTION LIGHT
Pb SUBSTRATE
Pt COMPONENT
H PROJECTING PORTION

The invention claimed is:

1. A component mounting device comprising:
a substrate conveyance path that conveys a substrate while supporting the substrate from below;
a light projector that projects inspection light in a direction orthogonal to a direction of conveyance of the substrate by the substrate conveyance path and a light receiver that receives the inspection light projected by the light projector;
an end detection unit which, according to a change in an amount of inspection light received by the light receiver, detects that an end of the substrate conveyed by the substrate conveyance path in a direction parallel to the substrate conveyance path or an end of a portion projecting outside from an end of a component mounted on the substrate in a direction parallel to the substrate conveyance path for the substrate has reached the inspection light;
a substrate positioning control unit which immediately halts operation of the substrate conveyance path when the end detection unit detects that the end of the substrate has reached the inspection light and which, when the end detection unit detects that the end of the component mounted on the substrate has reached the inspection light, activates the substrate conveyance path such that the substrate moves in a projecting direction of the projecting portion over a distance equivalent to a projection length of the projecting portion reached the inspection light and subsequently halts the substrate conveyance path, thereby positioning the substrate; and
a mounting section that mounts components on the substrate positioned by the substrate positioning control unit.

2. The component mounting device according to claim 1, further comprising a projection length data calculation unit that calculates data pertaining to projection lengths of respective components from data including locations on the substrate where components to be mounted on the substrate are mounted and outer dimensions of the components.

3. The component mounting device according to claim 1, further comprising a projection length data input unit that inputs data pertaining to a projection length on a per-component basis.

4. A component mounting system that is built by arranging side by side the plurality of component mounting devices defined in claim 1 and that sequentially delivers a substrate among the plurality of component mounting devices and that shares operation for mounting the components on the substrate among the respective component mounting devices, wherein projection length data pertaining to the substrate on which the components are mounted by an upstream component mounting device are delivered to the downstream component mounting device.

5. The component mounting system according to claim 4, wherein the projection length data delivered from the upstream component mounting device to the downstream component mounting device are only projection length data pertaining to a component having the largest projection length among the components mounted on the substrate by the upstream component mounting device.

6. A component mounting method comprising:
a substrate conveyance step of conveying a substrate while supporting both sides of the substrate from below by a substrate conveyance path;
a substrate positioning step of immediately halting operation of the substrate conveyance path when an end of the substrate achieved in a direction parallel to the substrate conveyance path is detected to have reached inspection light projected in a direction orthogonal to a direction of conveyance of the substrate and, when the end of the portion of the component on the substrate projecting outside from the end of the substrate in the direction parallel to the substrate conveyance path has reached the inspection light, halting operation of the substrate conveyance path after having activated the substrate conveyance path such that the substrate moves in a projecting direction of the projecting portion over a distance equivalent to a projection length of the projecting portion reached the inspection light, thereby positioning the substrate; and
a mounting step of mounting components on the substrate positioned.

* * * * *